(12) United States Patent
Hochberg et al.

(10) Patent No.: US 8,203,115 B2
(45) Date of Patent: Jun. 19, 2012

(54) METHOD OF PERFORMING HYPERSPECTRAL IMAGING WITH PHOTONIC INTEGRATED CIRCUITS

(75) Inventors: Michael J. Hochberg, Seattle, WA (US); Tom Baehr-Jones, Seattle, WA (US)

(73) Assignee: University of Washington, Seatle, WA (US)

( * ) Notice: Subject to any disclaimer, the term of this patent is extended or adjusted under 35 U.S.C. 154(b) by 510 days.

(21) Appl. No.: 12/511,346

(22) Filed: Jul. 29, 2009

(65) Prior Publication Data

US 2010/0187402 A1 Jul. 29, 2010

Related U.S. Application Data

(60) Provisional application No. 61/084,513, filed on Jul. 29, 2008.

(51) Int. Cl.
*G02B 6/26* (2006.01)
(52) U.S. Cl. ............... 250/226; 250/339.01; 250/339.02; 250/216
(58) Field of Classification Search ................... 250/216, 250/226, 339.01, 339.02
See application file for complete search history.

(56) References Cited

U.S. PATENT DOCUMENTS

| | | | |
|---|---|---|---|
| 7,135,698 B2 * | 11/2006 | Mitra | 257/21 |
| 7,601,946 B2 * | 10/2009 | Powers et al. | 250/226 |
| 8,116,603 B2 * | 2/2012 | Popovic | 385/28 |

OTHER PUBLICATIONS

Nielson et al, "Integrated Wavelength selective opticla MEMS switching Using Ring Resonator Filters", Jun. 2005, IEEE photonics Technology Letters, vol. 17, No. 6.*

* cited by examiner

*Primary Examiner* — Tony Ko
(74) *Attorney, Agent, or Firm* — Milstein Zhang & Wu LLC; Joseph B. Milstein

(57) ABSTRACT

According to the invention, an integrated hyperspectral imager includes a planar photonic substrate. A plurality of imaging pixel photonic circuits is disposed in a M×N array on the planar photonic substrate. Each imaging pixel photonic circuit includes an input coupler configured to receive a broadband input electromagnetic radiation. A waveguide is optically coupled to the input coupler. A plurality of wavelength filters is optically coupled to the waveguide. Each wavelength filter has a wavelength filter input and a wavelength filter output. Each detector has a detector input optically coupled respectively to each of the wavelength filter outputs. Each detector has a respective detector output. The integrated hyperspectral imager is configured to provide electrical signals that are representative of a hyperspectral image of the received broadband input electromagnetic radiation. A method for recording an image based on a received electromagnetic radiation is also described.

23 Claims, 21 Drawing Sheets

METHOD OF PERFORMING HYPERSPECTRAL IMAGING WITH PHOTONIC INTEGRATED CIRCUITS

CROSS-REFERENCE TO RELATED APPLICATIONS

This application claims priority to and the benefit of U.S. provisional patent application Ser. No. 61/084,513, filed Jul. 29, 2008, which application is incorporated herein by reference in its entirety.

FIELD OF THE INVENTION

The invention relates to a hyperspectral imager in general and more particularly to a hyperspectral imager photonic integrated circuit.

BACKGROUND OF THE INVENTION

CCD and CMOS imaging integrated circuits (IC) as well as other conventional imaging ICs are commonly used to capture images in real-time at visible and other wavelengths. Imaging ICs commonly form the basis for many modern photographic and video recording devices. One limitation of such devices, however, is that they only detect the total intensity of an incident beam of electromagnetic radiation.

An existing enhancement to conventional IC imaging arrays of the prior art is the ability to detect not just an image, but to detect the image at a number of different wavelengths. Detecting an image at a number of different wavelengths can be accomplished by creating pixels that are able to read the intensity at several different wavelengths simultaneously. Such an imaging device is known in the art as a hyperspectral imager.

What is needed is an inexpensive and more efficient hyperspectral imager integrated circuit.

SUMMARY OF THE INVENTION

According to one aspect of the invention, an integrated hyperspectral imager includes a planar photonic substrate. A plurality of imaging pixel photonic circuits is disposed in a M×N array on the planar photonic substrate. Each imaging pixel photonic circuit includes an input coupler configured to receive a broadband input electromagnetic radiation. A waveguide is optically coupled to the input coupler. A plurality of wavelength filters is optically coupled to the waveguide. Each wavelength filter of the plurality of wavelength filters has a wavelength filter input and a wavelength filter output. Each detector of a plurality of detectors has a detector input optically coupled respectively to each of the wavelength filter outputs. Each detector of the plurality of detectors has a respective detector output. The integrated hyperspectral imager is configured to provide at the detector outputs of each of the plurality of imaging pixel photonic circuits, electrical signals that are representative of a hyperspectral image of the received broadband input electromagnetic radiation.

In one embodiment, the planar photonic substrate includes a waveguide including a material containing an element from Group IV of the periodic table.

In another embodiment, the waveguide includes a material containing an element from Group IV of the periodic table that is selected from the group of planar photonic substrate including a silicon-on-insulator technology, polycrystalline silicon on oxide, amorphous or nanocrystalline silicon on oxide, germanium on insulator, or silicon on sapphire.

In yet another embodiment, the planar photonic substrate includes a silicon-on-insulator technology.

In yet another embodiment, the broadband input electromagnetic radiation includes a range of wavelengths within a range of electromagnetic radiation from visible wavelengths to infrared wavelengths.

In yet another embodiment, the at least one wavelength filter of the plurality of wavelength filters includes a ring resonator based filter.

In yet another embodiment, the at least one wavelength filter of the plurality of wavelength filters includes a Mach-Zehnder based filter.

In yet another embodiment, the integrated hyperspectral imager further includes a focusing layer configured to focus incident light onto each input coupler.

In yet another embodiment, the focusing layer includes a plurality of lenses.

In yet another embodiment, the at least one lens of the plurality of lenses includes a Fresnel lens.

In yet another embodiment, the at least one lens of the plurality of lenses includes a diffractive lens based on a series of partial etch heights in a dielectric.

In yet another embodiment, the input coupler includes a grating coupler.

In yet another embodiment, the input coupler includes a plurality of periodic scattering structures.

In yet another embodiment, the input coupler includes an etched edge input coupler.

In yet another embodiment, the light is coupled from an edge of the imager.

In yet another embodiment, the at least one detector of the plurality of detectors includes a photodiode.

In yet another embodiment, the integrated hyperspectral imager further includes an electronic circuit electrically disposed between the detector and the detector output, the electronic circuit integrated on the planar photonic substrate.

In yet another embodiment, the integrated hyperspectral imager further includes at least one lens configured to receive light from an image to be recorded. The at least one lens is optically coupled to at least one input coupler of the integrated hyperspectral imager. An electronic circuit is electrically coupled to at least one detector output of the integrated hyperspectral imager. The electronic circuit is configured to process at least one of the electrical signals representative of a hyperspectral image. A memory is configured to record the image as a digital recording. The combination of the integrated hyperspectral imager, the at least one lens, the electronic circuit and the memory is configured to provide an optical recording capability.

In yet another embodiment, the optical recording capability includes a selected one of a still image recording capability, a sequential still image recording capability, and a video image recording capability.

In yet another embodiment, the integrated hyperspectral imager further includes at least one lens configured to receive light from an image to be recorded. The at least one lens is optically coupled to at least one input coupler of the integrated hyperspectral imager. An electronic circuit is electrically coupled to at least one detector output of the integrated hyperspectral imager. The electronic circuit is configured to process at least one of the electrical signals representative of a hyperspectral image. A transmission circuit is configured to transmit the image for further use. The combination of the integrated hyperspectral imager, the at least one lens, the electronic circuit and the transmission circuit are configured to provide an optical imaging capability.

According to another aspect, a method for processing an image based on a received electromagnetic radiation includes the steps of: providing a photonic integrated hyperspectral imager as described hereinabove, the photonic integrated hyperspectral imager configured to process in real-time broadband input electromagnetic radiation having at least a first wavelength and a second wavelength; acquiring an image at the first wavelength; and if the image is to be recorded, recording the image at the first wavelength to memory; or if the image is to be transmitted, transmitting the image at the first wavelength to a user thereof; acquiring an image at the second wavelength; and if the image is to be recorded, recording the image at the second wavelength to memory; or if the image is to be transmitted, transmitting the image at the second wavelength to a user thereof.

In one embodiment, the steps of acquiring an image at the first wavelength and acquiring an image at the second wavelength are performed contemporaneously.

In another embodiment, the steps of acquiring an image at the first wavelength and acquiring an image at the second wavelength are performed sequentially.

In yet another embodiment, the steps of acquiring an image at the first wavelength and acquiring an image at the second wavelength are performed sequentially by dithering the wavelength filters.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 10C is a diagram that shows a plot of modal patterns over four periods of a segmented waveguide on a horizontal plane that intersects the silicon layer halfway through.

DETAILED DESCRIPTION

Figure 1:
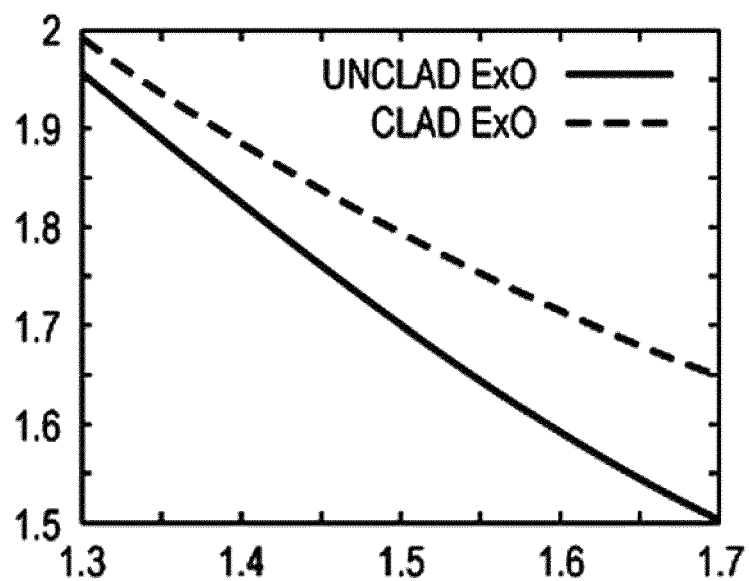
FIG. 1 is a diagram showing dispersion plots for the fundamental mode (Ex polarized) of exemplary clad and unclad waveguides, shown as effective index vs. wavelength in μm.

We now describe high index contrast waveguides that are useful to concentrate light in order to enhance nonlinear optical effects in various materials so that such effects can be employed to manipulate light (or more generally electromagnetic radiation) at low power levels, as compared to conventional systems and methods that employ nonlinear optical materials. The manipulation of electromagnetic radiation or light can be useful to provide a variety of components that perform operations on light such as rectification, modulation, filtering, and logic operations in a manner analogous to the same operations which are provided using electronic devices operating on electrical signals. For example, an input light wave to be processed is impressed onto the component. The light wave has at least one parameter characterizing the light wave, such as one of an intensity, a polarization, a frequency, a wavelength, and a duration (e.g., a pulse length, or in the case of continuous wave light, an effectively infinite duration). After the input light wave is processed (or interacts with the waveguide and the clad nonlinear optical material adjacent to the waveguide when present), an output signal is observed. In a circumstance where the input signal has been processed, the output signal has at least one parameter that is different from at least one parameter characterizing the input light wave, including possibly an electrical output signal when the input light wave had no electrical signal component (e.g., optical rectification).

We have developed a set of tools for concentrating light to a high degree by using silicon or other high index contrast waveguides, and we have fabricated devices that demonstrate some of the many applications that can be contemplated when such nonlinear materials are exploited. In particular, by utilizing split waveguides, we are able to greatly enhance the optical fields in the cladding of a tightly confined waveguide, without greatly enhancing the optical losses of the same waveguide. Combining the high field concentrations available from the split waveguides with the high nonlinear activity of nonlinear optical polymers permits the development of nonlinear optical devices operating at much lower optical input power levels than are possible with conventional free space or chip based systems. We have demonstrated four-wave mixing (which is based upon $\chi^3$), as well as optical rectification (based on $\chi^2$), in such waveguides. Using these waveguides it is possible to decrease the power levels needed to observe significant nonlinearities to the point where, by contrast with conventional nonlinear optics, it can be done with non-pulsed, continuous wave lasers.

Chi2 ($\chi^2$) and Chi3 ($\chi^3$) based optical effects can be used in particular to build on-chip optical parametric oscillator ("OPO") systems, where two input wavelengths can be mixed together to produce sum and difference frequencies. These frequencies can be either higher or lower than the input frequencies, and can be made tunable. These effects work for frequencies from the ultraviolet and X-ray regime all the way out into the far infrared and microwave, and in fact can work down to DC in some cases, particularly with optical rectification.

The material of which the high index waveguide is made can be any material having a high index that is reasonably transparent at the wavelengths of interest. This can include but is not limited to silicon, gallium nitride, indium phosphide, indium gallium nitride, gallium phosphide, diamond, sapphire, or the various quaternary III/V and II/VI materials such as aluminum gallium arsenide phosphide. III/V denotes materials having at least one element from column III of the periodic table of elements (or an element that is stable as a positive trivalent ion) and at least one element from column V (or an element that is stable as a negative trivalent ion). Examples of III/V compounds include BN, AlP, GaAs and InP. II/VI denotes materials having at least one element from column II of the periodic table of elements (or an element that is stable as a positive divalent ion) and at least one element from column VI (or an element that is stable as a negative divalent ion). Examples of II/VI compounds include MgO, CdS, ZnSe and HgTe.

We present successively the mechanical structure of exemplary embodiments of high index waveguides, exemplary embodiments of cladding materials having large nonlinear constants $\chi^2$ and $\chi^3$ and their incorporation into devices having high index waveguides, and some exemplary results observed on some of the fabricated devices that are described.

Exemplary High Index Waveguide Structures

High-Q Ring Resonators in Thin Silicon-on-Insulator

Resonators comprising high-Q microrings were fabricated from thin silicon-on-insulator (SOI) layers. Measured Q values of 45,000 were observed in these rings, which were then improved to 57,000 by adding a PMMA cladding. Various waveguide designs were calculated, and the waveguide losses were analyzed.

Microring resonator structures as laser sources and as optical filter elements for dense wavelength division multiplexing systems have been studied in the past. The silicon-on-insulator (SOI) structure described here is particularly advantageous. It has low waveguide loss. One can extrapolate an uncoupled Q value of 94,000 and a waveguide loss of 7.1 dB/cm in the unclad case, and −6.6 dB/cm in the PMMA clad case, from the respective measured Q values of 45,000 and 57,000. Although higher Q values have been obtained for optical microcavities, we believe that our geometry has the highest Q for a resonator based on a single mode silicon waveguide. It is also noteworthy that a large amount of power appears outside the core silicon waveguide, which may be important in some applications. The modes that are described herein have approximately 57% of the power outside the waveguide, as compared to 20% for a single-mode 200-nm-thick silicon waveguide, and 10% for a single-mode 300-nm-thick silicon waveguide.

In one embodiment, wafer geometries were selected that minimize the thickness of the SOI waveguiding layer as well as the buried oxide, but still yield low loss waveguides and bends. A number of different waveguide widths were compared by finite difference based mode solving. The geometry used in the exemplary embodiment comprises a 500-nm-wide waveguide formed in a 120-nm-thick silicon layer, atop a 1.4 μm oxide layer, which rests on a silicon handle, such as a silicon wafer as a substrate. Such a configuration supports only a single well-contained optical mode for near infrared wavelengths. The dispersion characteristics are shown in FIG. 1 for both unclad and PMMA-clad waveguides. Our interest in unclad structures stems from the ease of fabrication, as detailed in the following, as well as the flexibility an open air waveguide may provide for certain applications.

These modes were determined by using a finite difference based Hermitian eigensolver. It is possible to calculate the loss directly from the mode pattern with an analytic method valid in the low-loss limit. The waveguide loss at 1.55 μm calculated in such a fashion is approximately −4.5 dB. This loss figure was in agreement with the extrapolated results of FDTD simulation.

Because a loss of −4 dB/cm is attributed to substrate leakage, the waveguide loss can be improved by the addition of a cladding, which tends to pull the mode upwards. This notion is supported by the measured decrease in waveguide loss upon the addition of a PMMA cladding. It can be shown that the substrate leakage loss attenuation coefficient is nearly proportional to $$e^{-2\sqrt{n_{\mathit{eff}}^2 - n_o^2} k_0 A}$$

if $k_0$ is the free space wave number, $n_{\mathit{eff}}$ is the effective index of the mode, $n_o$ is the effective index of the oxide layer, and A is the thickness of the oxide. In the present case, the e-folding depth of the above-mentioned function turns out to be 180 nm, which explains why the substrate leakage is so high.

SOI material with a top silicon layer of approximately 120 nm and 1.4 μm bottom oxide was obtained in the form of 200 mm wafers, which were manually cleaved, and dehydrated for 5 min at 180° C. The wafers were then cleaned with a spin/rinse process in acetone and isopropanol, and air dried. HSQ electron beam resist from Dow Corning Corporation was spin coated at 1000 rpm and baked for 4 min at 180° C. The coated samples were exposed with a Leica EBPG-5000+ electron beam writer at 100 kV. The devices were exposed at a dose of 4000 μc/cm$^2$, and the samples were developed in MIF-300 TMAH developer and rinsed with water and isopropanol. The patterned SOI devices were subsequently etched by using an Oxford Plasmalab 100 ICP-RIE within 12 mTorr of chlorine, with 800 W of ICP power and 50 W of forward power applied for 33 s. Microfabricated devices such as the one shown in FIG. 2 were tested by mounting the dies onto an optical stage system with a single-mode optical fiber array. A tunable laser was used first to align each device, and then swept in order to determine the frequency domain behavior of each of the devices. Light was coupled into the waveguides from a fiber mode by the use of grating couplers. Subsequently the devices were spin-coated with 11% 950 K PMMA in Anisole, at 2000 rpm, baked for 20 min at 180° C., and retested.

The theoretical development of the expected behavior of a ring resonator system has been described in the technical literature. In the present case the dispersion of the waveguide compels the addition of a dispersive term to the peak width. We take $\lambda_0$ to be the free space wavelength of a resonance frequency of the system, $n_0$ to be the index of refraction at this wavelength, $(\delta n/\delta \lambda)_0$, the derivative of n with respect to $\lambda$ taken at $\lambda_0$, L to be the optical path length around the ring, α to be the optical amplitude attenuation factor due to loss in a single trip around the ring, and finally t to be the optical amplitude attenuation factor due to traveling past the coupling region. In the limit of a high Q, and thus $(1-\alpha) \ll 1$ and $(1-t) \ll 1$, we have $$Q = (\pi L/\lambda_0)[n_0 - \lambda_0 (\delta n/\delta \lambda)_0]/(1-\alpha t) \quad (1)$$

Figure 2:
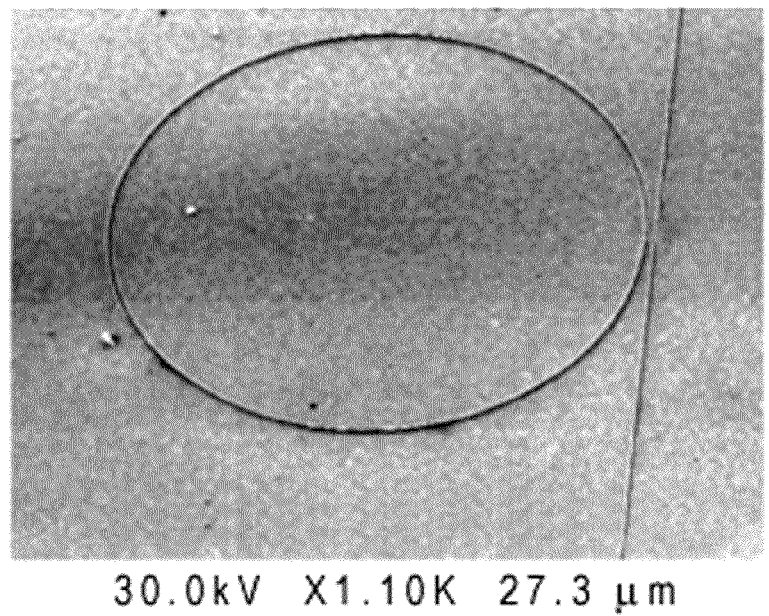
FIG. 2 is a diagram showing an SEM image of an exemplary ring resonator.
Figure 3:
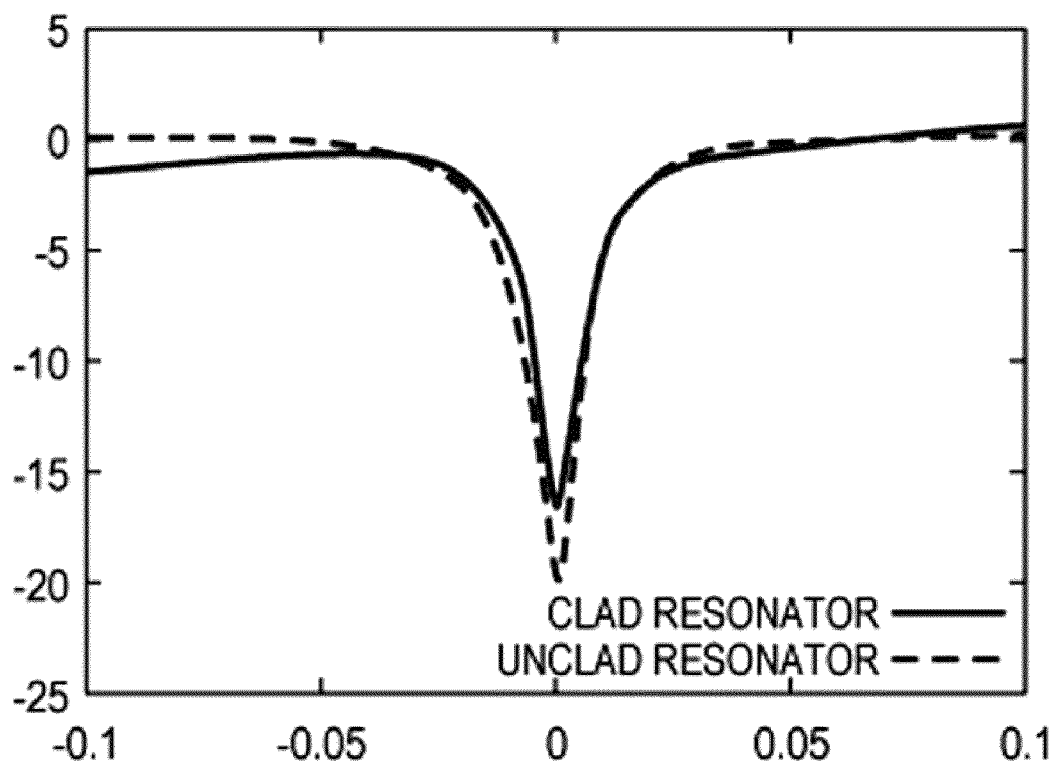
FIG. 3 is a diagram showing the normalized transmission of light through the system (and past the ring) in dB, as a function of wavelength detuning in nm for both clad and unclad waveguides, shifted to overlay resonance peaks.

The waveguide mode was coupled into a ring resonator from an adjacent waveguide. As shown in FIG. 2, the adjacent waveguide can in some embodiments be a linear waveguide. The strength of coupling can then be lithographically controlled by adjusting the distance between the waveguide and the ring. This ring was fabricated with a radius of 30 μm, a waveguide width of 500 nm, and a separation between ring and waveguide of 330 nm. For the clad ring presented, the measured Q is 45,000, and the extinction ratio is −22 dB, for the resonance peak at 1512.56 nm. The PMMA clad ring had a similar geometry, and achieved a Q of 57,000, but with an extinction ratio of −15.5 dB. Typical observed transmission spectra are shown in FIG. 3. The typical amount of optical power in the waveguide directly coupling into the resonator was about 0.03 mW. A dependence of the spectrum on this power was not observed, to within an order of magnitude.

From the mode-solving results for the unclad waveguides, we have $(\delta n/\delta \lambda)(1.512) = -1.182$ μm$^{-1}$, and $n(\lambda = 1.512) = 1.688$. Using this result and the earlier relations, the waveguide loss can be calculated from the measured Q value. Specifically, an extinction that is at least −22 dB indicates that a critically coupled Q in this geometry is greater than 38,500, which then implies a waveguide loss of less than −7.1 dB/cm. In similar fashion, the PMMA clad waveguide resonator with a Q of 57,000 but only −15.5 dB of extinction allows a worst case waveguide loss of −6.6 dB/cm. This also implies an intrinsic Q of 77,000 for the unclad resonator, and an intrinsic Q of 94,000 for the PMMA clad resonator.

These devices have a slight temperature dependence. Specifically, the resonance peak shifts correspondingly with the change in the refractive index of silicon with temperature, moving over 2 nm as temperature shifts from 18 to 65° C. The Q rises with higher temperatures slightly, from 33 k at 18° C. to 37 k on one device studied. This shift can probably be explained entirely by the dependence of Q on the effective index.

High-Q Optical Resonators in Silicon-on-Insulator Based Slot Waveguides

We now describe the design, fabrication and characterization of high Q oval resonators based on slot waveguide geometries in thin silicon on insulator material. Optical quality factors of up to 27,000 were measured in such filters, and we estimate losses of −10 dB/cm in the slotted waveguides on the basis of our resonator measurements. Such waveguides enable the concentration of light to very high optical fields within nano-scale dimensions, and show promise for the confinement of light in low-index material with potential applications for optical modulation, nonlinear optics and optical sensing. As will be appreciated, the precise geometry of a resonator (or other kinds of devices) is frequently a matter of design, and the geometry can be varied based on such considerations as length of waveguide, area of a chip, and required interaction (or required non-interaction), such as coupling (or avoiding coupling) with other waveguide structures that are present in a device or on a chip. In some embodiments, the waveguide can be a closed loop, such as at least one ring or at least one oval shaped endless stripe. As has been explained, optical energy can be provided to such a closed loop, for example with an input waveguide.

One can form high quality factor ring or oval resonators in SOI. In these SOI waveguides, vertical confinement of light is obtained from the index contrast between the silicon core and the low index cladding (or air) and the buried silicon dioxide layer, whereas lateral confinement can be obtained by lithographically patterning the silicon. The majority of the light tends to be guided within the silicon core in such waveguide. Although the high refractive index contrast between silicon and its oxide provide excellent optical confinement, guiding within the silicon core can be problematic for some applications. In particular, at very high optical intensities, two-photon absorption in the silicon may lead to high optical losses. Moreover, it is often desirable to maximize the field intensity overlap between the optical waveguide mode and a lower index cladding material when that cladding is optically active and provides electro-optic modulation or chemical sensing.

One solution to these problems involves using a slot waveguide geometry. In a slot waveguide, two silicon stripes are formed by etching an SOI slab, and are separated by a small distance. In one embodiment, the separation is approximately 60 nm. The optical mode in such a structure tends to propagate mainly within the center of the waveguide. In the case of primarily horizontal polarization, the discontinuity condition at the cladding-silicon interface leads to a large concentration of the optical field in the slot or trench between the two stripes. One can predict that the electric field intensity would be approximately $10^8 \sqrt{P}$ V/m where P is the input power in watts. One design uses a 120 nm silicon on insulator layer and 300 nm wide silicon strips on top of a 1.4 μm thick buried oxide layer, which is in turn deposited on a silicon substrate. Various widths for the central slot were fabricated to provide test devices with 50, 60 and 70 nm gaps. Slots larger than 70 nm have also been fabricated and were shown to work well.

In the 1.4-1.6 μm wavelength regime, the waveguide geometry is single mode, and a well-contained optical mode is supported between the two silicon waveguide slabs. There is some loss that such an optical mode will experience even in the absence of any scattering loss or material absorption due to leakage of light into the silicon substrate. The substrate loss can be estimated semi-analytically via perturbation theory, and ranges from approximately −0.15 dB/cm at 1.49 μm to about −0.6 dB/cm at 1.55 μm for the SOI wafer geometry of the present embodiment.

Figure 4:
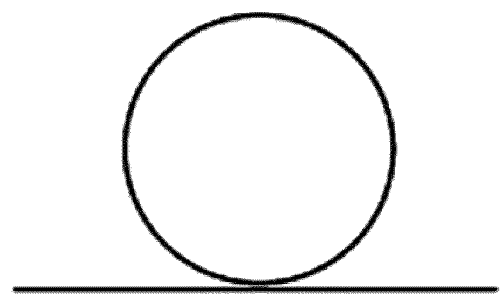
FIG. 4 is a diagram showing the device layout of an exemplary slot waveguide.

Oval resonators were fabricated by patterning the slot waveguides into an oval shape. An oval resonator geometry was selected in preference to the more conventional circular shape to enable a longer coupling distance between the oval and the external coupling waveguide or input waveguide. See FIG. 4. Slots were introduced into both the oval and external coupling waveguides.

Predicting coupling strength and waveguide losses for such devices is not easy. Many different coupling lengths and ring to input waveguide separations were fabricated and tested. It is well known that the most distinct resonance behavior would be observed for critically coupled resonators, in which the coupling strength roughly matches the round trip loss in the ring.

An analytic expression for the quality factor of a ring resonator was presented in equation (1) hereinabove. Also, the free spectral range can be calculated via:

$$\Delta\lambda = (\lambda_0/L)/[1/L + n_0/\lambda_0 - (\delta n/\delta\lambda)_0] \quad (2)$$

Here, L is the round trip length in the ring, and $n_0$ and $\lambda_0$ are the index of refraction, and the wavelength at resonance, respectively. The derivative of the effective index with respect to the wavelength at the resonance peak is given by $(\delta n/\delta\lambda)_0$, and it can be shown that this term is roughly equal to −0.6 $\mu m^{-1}$ from the 1.4-1.6 μm spectral range for the slot waveguides studied here.

Figure 5:
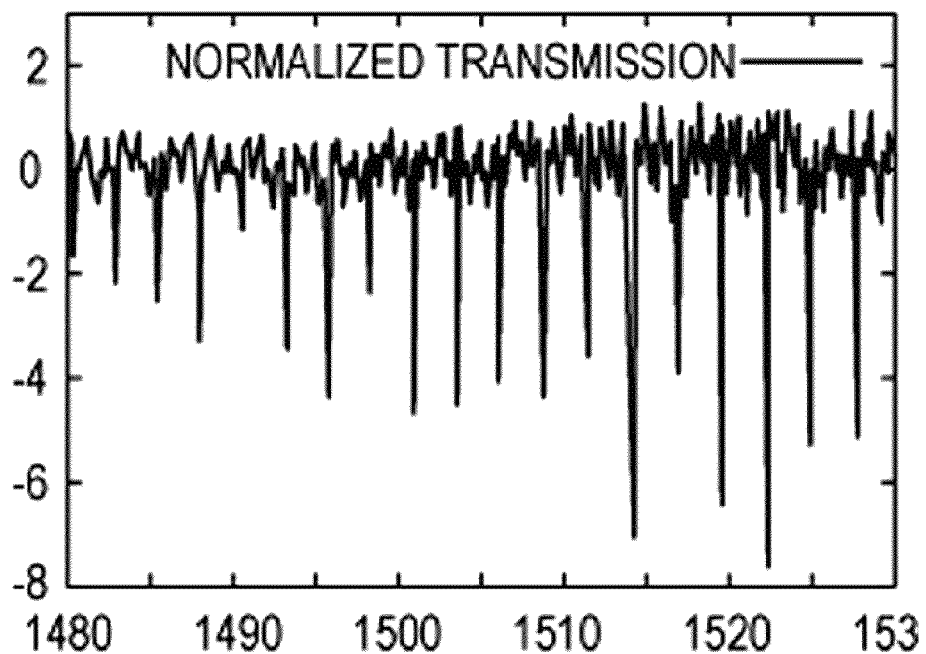
FIG. 5 is a diagram showing the measured transmission spectrum in dB vs. laser wavelength in nm past a high quality factor slot ring resonator.
Figure 6:
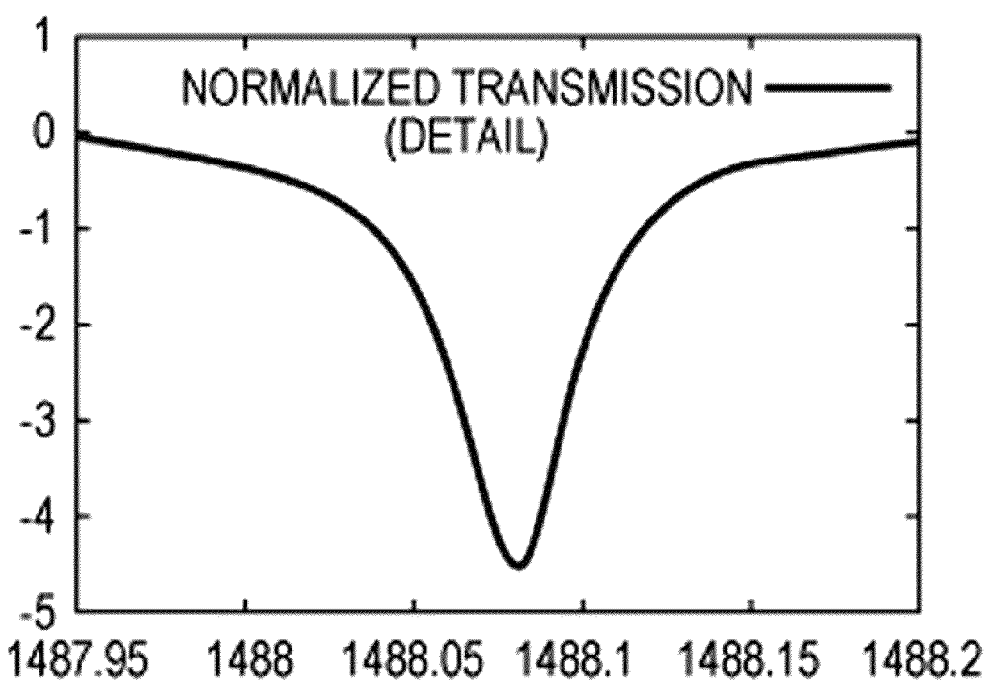
FIG. 6 is a diagram showing the detail of the peak of the transmission spectrum near 1488 nm.

We have observed a quality factor of 27,000 in a device fabricated with a slot size of 70 nm, a ring to input waveguide edge to edge separation of 650 nm, and a coupling distance of 1.6 μm. The radius of the circular part of the slotted oval was 50 μm. This resonance was observed near 1488 nm, and the resonance peak had an extinction ratio of 4.5 dB. FIG. 5 shows the measured transmission spectrum past the ring, normalized for the input coupler baseline efficiency of our test system. FIG. 6 shows the details of one peak in the vicinity of 1488 nm. Because the extinction ratio at the resonance peak was not very large in this case, it was not possible to accurately determine waveguide losses from this device. By measuring many devices with different geometries, we obtained data on resonators with higher extinction ratios that approached critical coupling. One such device was a 50 μm radius slotted ring resonator with a 60 nm waveguide gap, a ring to input waveguide spacing of 550 nm and coupling length of 1.6 μm. In this device, a Q of 23,400 was observed near 1523 nm, with an on-resonance extinction of 14.7 dB.

Since this resonance is nearly critically coupled, the waveguide loss can be estimated using equation (1) as −10 dB/cm. We can also use equation (2) to further validate our theoretical picture of the ring resonator. The observed free spectral range of this resonator was 2.74 nm, while equation (2) predicts 2.9 nm. This discrepancy is most likely due to small differences in the fabricated dimensions as compared to those for which the numerical solutions were obtained.

To further validate the waveguide loss result, several waveguide loss calibration loops were fabricated with varying lengths of the slot waveguide, ranging from 200 to 8200 um in length. A total of five center slot waveguide devices were studied for each of the 50, 60 and 70 nm slot widths. Linear regression analysis on the peak transmission of each series yielded waveguide loss figures of 11.6±3.5 dB/cm for the 50 nm center waveguide, 7.7±2.3 dB/cm for the 60 nm center waveguide, and 8.1±1.1 dB/cm for the 70 nm center waveguide. These figures are in agreement with the loss estimated from the oval resonator. Since the theoretical loss due to substrate leakage is much lower than this, it is clear that a great deal of loss is due to surface roughness and possibly material absorption. It is believed that engineering improvements will decrease this loss further. For sensing and modulation applications as well as use in nonlinear optics, the high optical field concentration that can be supported in the cladding material of the slotted waveguide geometry should be very advantageous when compared to more conventional waveguides.

Figure 7:
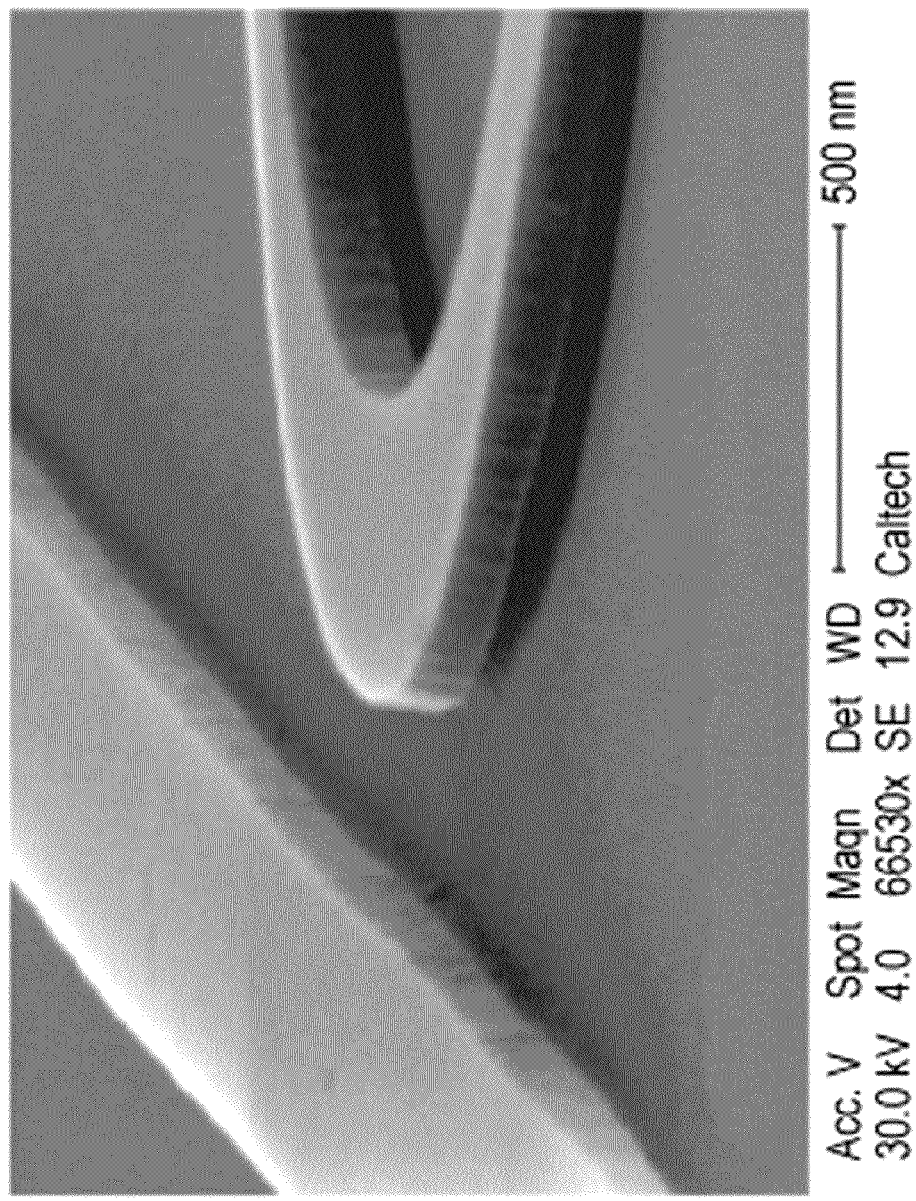
FIG. 7 is a diagram showing a shallow angle SEM view of a typical silicon-on-insulator ring resonator and waveguide having a sidewall roughness on the order of 10 nm.
Figure 8:
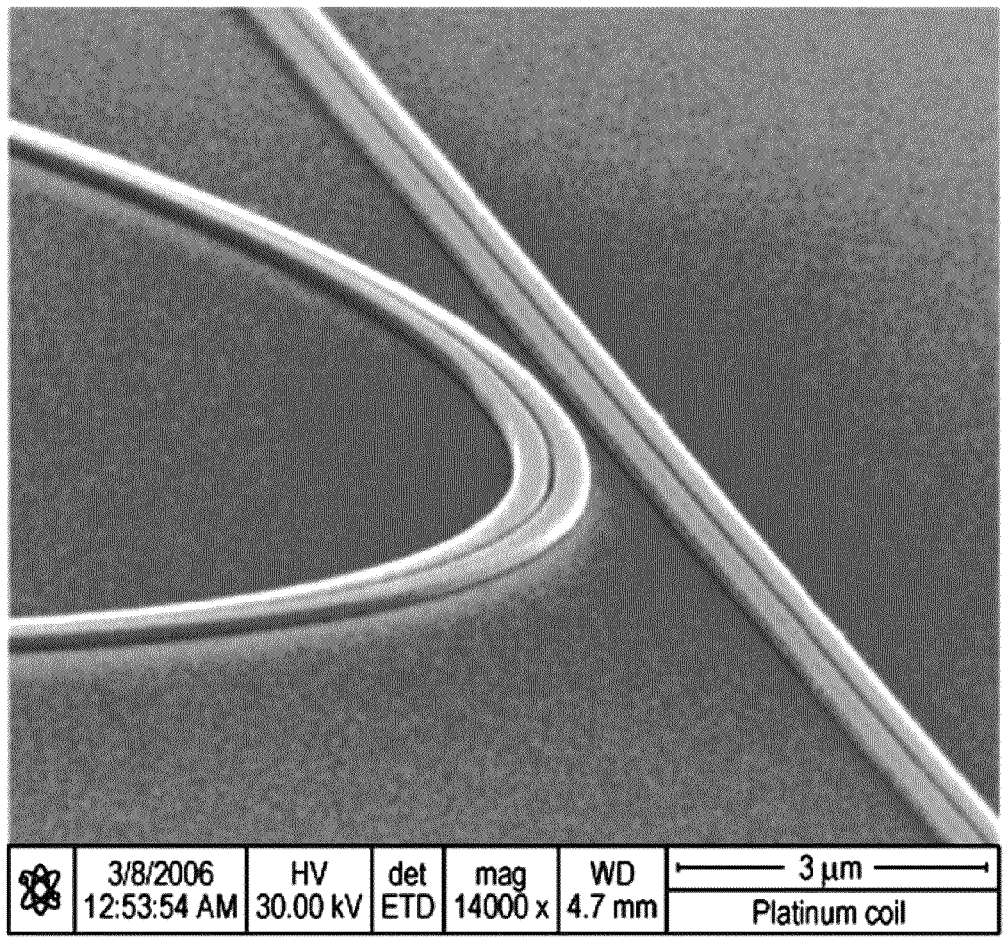
FIG. 8 is a diagram of a slot ring resonator directional coupler region, and the associated input waveguide.

FIG. 7 is a diagram showing a shallow angle SEM view of a silicon-on-insulator ring resonator and waveguide having a sidewall roughness on the order of 10 nm. In the exemplary waveguide shown in FIG. 7, the silicon-insulator bond has been decorated with a brief buffered oxide etch. FIG. 8 is a diagram of a slot ring resonator directional coupler region, and the associated input waveguide.

Figure 9:
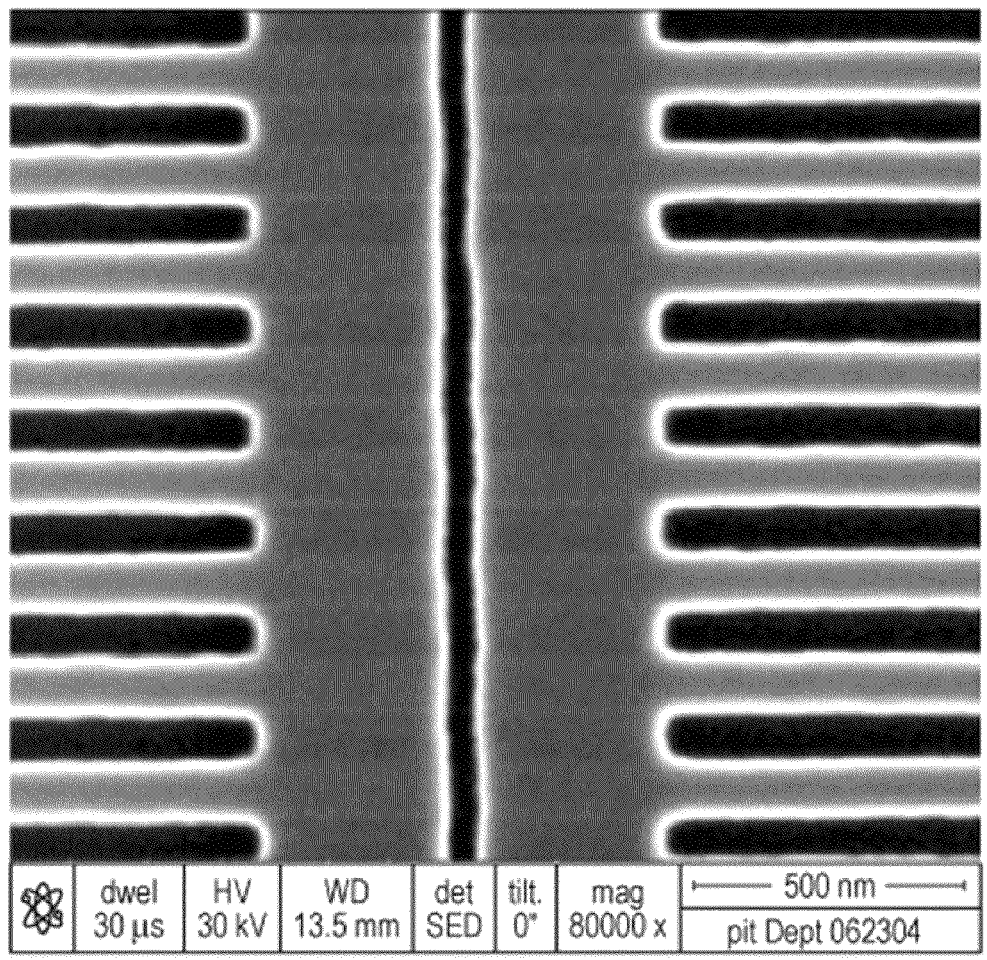
FIG. 9 is a diagram showing an exemplary high-index segmented waveguide structures, which in the embodiment shown comprises a central waveguide portion with fingers or ridges sticking out to the sides.

Other variations on the geometry of waveguides are possible. FIG. 9 is a diagram showing an exemplary high-index segmented waveguide structures, which in the embodiment shown comprises a central waveguide portion with fingers or ridges sticking out to the sides. With the light localized in the center in a Bloch mode, electrical contact can be established using the fingers or ridges that stick off the sides of the waveguide. This structure provides a way to form both electrical contacts to waveguides and structures that would provide electrical isolation with low optical loss. Through an iterative process involving a combination of optical design using a Hermetian Bloch mode eigensolver and fabrication of actual structures, it was found that (non-slotted) segmented waveguide structures could be constructed in 120 nm thick SOI. Waveguide losses as small as −16 dB per centimeter were observed, and insertion losses as small as −0.16 dB were shown from standard silicon waveguides.

Figure 10A:
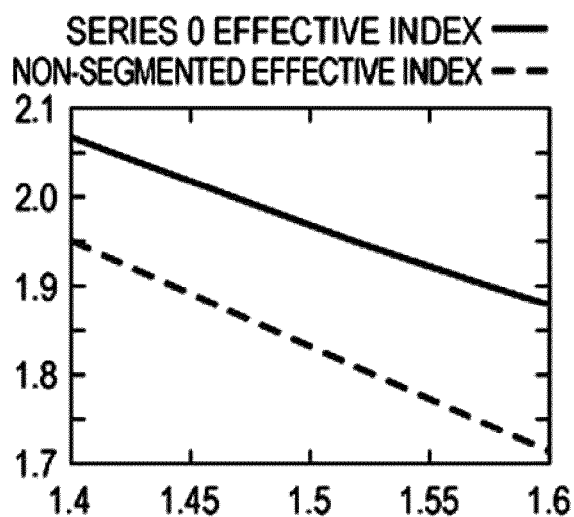
FIG. 10A is a diagram that shows a dispersion diagram of both a segmented waveguide and the normal, unsegmented waveguide, taken on a plane parallel to the substrate that on a z plane that intersects the middle of a segment.
Figure 10B:
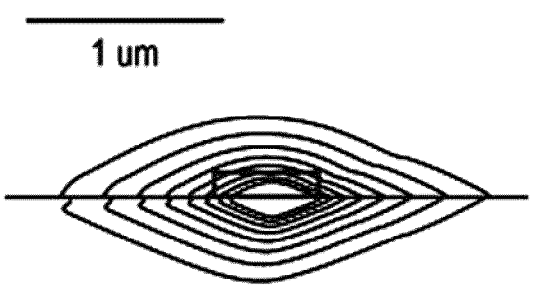
FIG. 10B is a diagram that shows modal patterns of the Bloch mode, with contours of |E| plotted, starting at 10% of the max value and with contour increments of 10%.
Figure 10C:
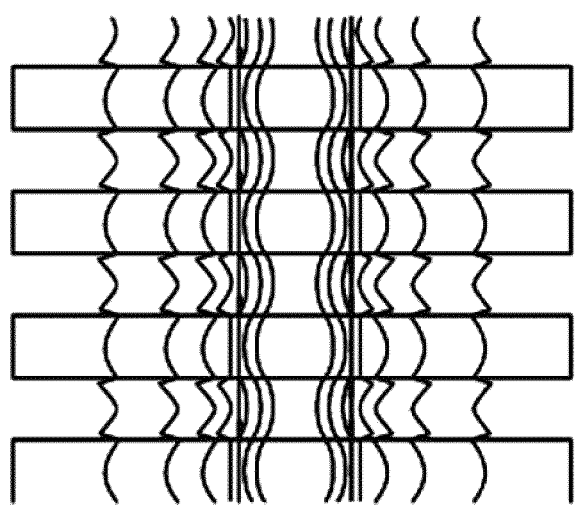

The segmented waveguide structure can also be modeled as regards its expected properties, which can then be compared to actual results. FIG. 10A is a diagram that shows a dispersion diagram of both a segmented waveguide and the normal, unsegmented waveguide, taken on a plane parallel to the substrate that on a z plane that intersects the middle of a segment. FIG. 10B is a diagram that shows modal patterns of the Bloch mode, with contours of |E| plotted, starting at 10% of the max value and with contour increments of 10%. FIG. 10C is a diagram that shows a plot of modal patterns over four periods of a segmented waveguide on a horizontal plane that intersects the silicon layer halfway through.

Figure 11:
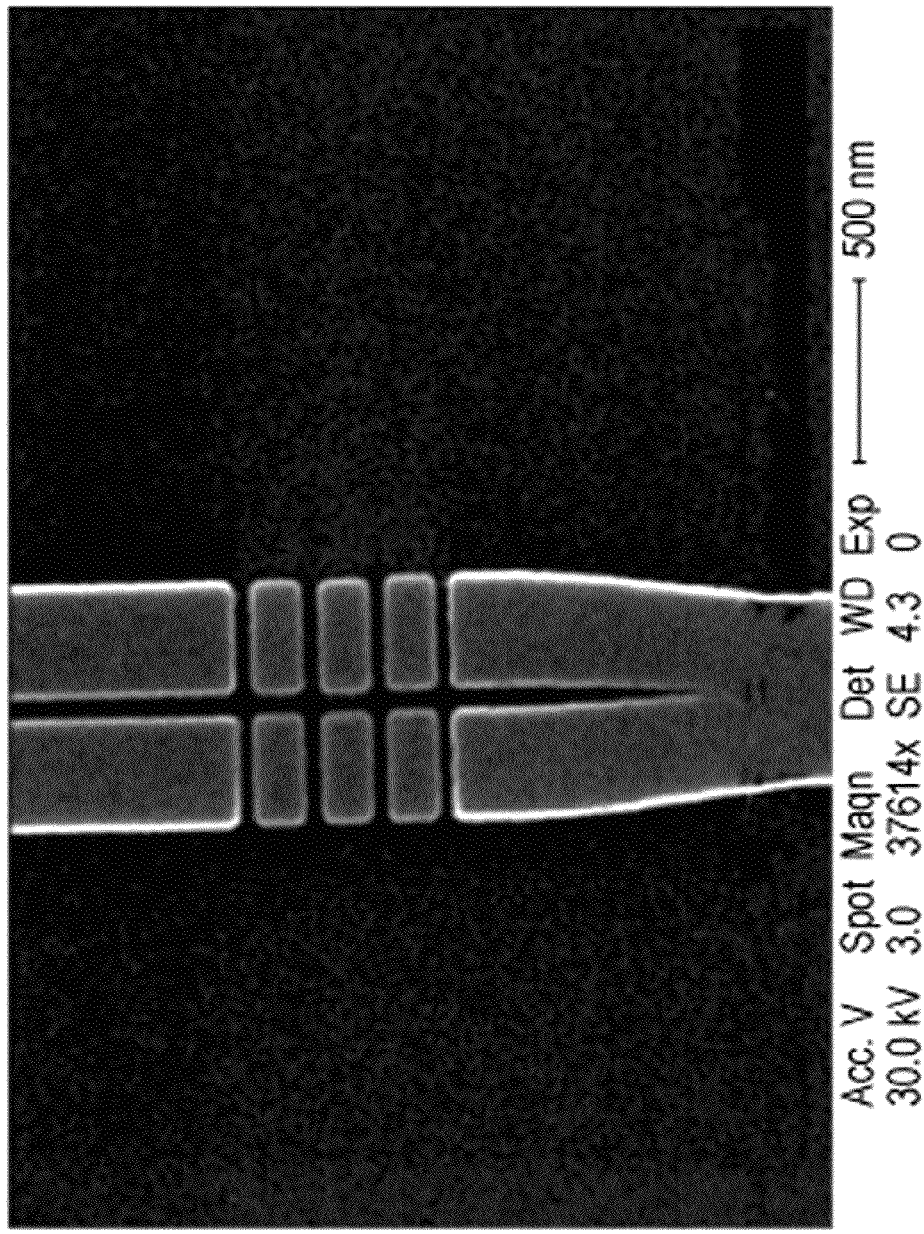
FIG. 11 is a diagram that shows an exemplary electrical isolator that was constructed and tested, and which provided both a transition from a standard to a slotted waveguide and electrical isolation between the two sides of the slot waveguide.

By utilizing the same type of design methodology as was used for the segmented waveguides, one is able to able to construct structures that provide electrical isolation without substantial optical loss. FIG. 11 is a diagram that shows an exemplary electrical isolator that was constructed and tested, and which provided both a transition from a standard to a slotted waveguide and electrical isolation between the two sides of the slot waveguide. Such structures were shown to have losses on the order of 0.5 dB.

Optical Modulation and Detection in Slotted Silicon Waveguides

In this example, we describe a system and process that provide low power optical detection and modulation in a slotted waveguide geometry filled with nonlinear electro-optic polymers and present examples that demonstrate such methods. The nanoscale confinement of the optical mode, combined with its close proximity to electrical contacts, enables the direct conversion of optical energy to electrical energy, without external bias, via optical rectification, and also enhances electro-optic modulation. We demonstrate this process for power levels in the sub-milliwatt regime, as compared to the kilowatt regime in which optical nonlinear effects are typically observed at short length scales. The results presented show that a new class of detectors based on nonlinear optics can be fabricated and operated.

Waveguide-based integrated optics in silicon provide systems and methods for concentrating and guiding light at the nanoscale. The high index contrast between silicon and common cladding materials enables extremely compact waveguides with very high mode field concentrations, and allows the use of established CMOS fabrication techniques to define photonic integrated circuits. By using slotted waveguides, it is possible to further concentrate a large fraction of the guided mode into a gap within the center of a silicon waveguide. This geometry greatly magnifies the electric field associated with the optical mode, resulting in electric fields of at least (or in excess of) $10^6$ V/m for continuous-wave, sub-milliwatt optical signals. Moreover, since the slotted geometry comprises two silicon strips which can be electrically isolated, a convenient mechanism for electro-optic interaction is provided. Such waveguides can be fabricated with low loss. We have previously described systems that provide losses below −10 dB/cm.

In the present example, we exploit both the high intensity of the optical field and the close proximity of the electrodes for several purposes. First, we demonstrate detection of optical signals via direct conversion to electrical energy by means of nonlinear optical rectification. An exemplary device comprises a ring resonator with an electro-optic polymer based $\chi^2$ material deposited as a cladding. Inside the slot, the high optical field intensity creates a standing DC field, which creates a virtual voltage source between the two silicon electrodes, resulting in a measurable current flow, in the absence of any external electrical bias. Though optical rectification has been observed in electro-optic polymers, typically instantaneous optical powers on the order of 1 kW are needed for observable conversion efficiencies, often achieved with pulsed lasers. The exemplary embodiment provides measurable conversion with less than 1 mW of non-pulsed input, obtained from a standard, low power tunable laser operating near 1500 nm.

In one embodiment, systems and methods of the invention provide standard Pockels' effect based modulation, which is similarly enhanced by means of the very small scale of our device. The close proximity of the electrodes, and ready overlap with the optical mode, causes an external voltage to produce a far larger effective electric modulation field, and therefore refractive index shift, than would be obtained through conventional waveguide designs. In one embodiment, the modulation and refractive index shift is provided by tuning the resonance frequencies of a slot waveguide ring resonator.

Device Fabrication

Waveguide Fabrication

The devices described in this example were fabricated in electronic grade silicon-on-insulator (SOI) with a top layer thickness of 110 nm and an oxide thickness of 1.3 microns. The silicon layer is subsequently doped to approximately $10^{19}$ Phosphorous atoms/cm$^3$, yielding resistivities after dopant activation of about 0.025 ohm-cm. Electro-optic ("EO") polymers were then spin-deposited onto the waveguide structures and subsequently poled by using a high field applied across the slot in the waveguide.

Lithography was performed using a Leica EBPG 5000+ electron beam system at 100 kv. Prior to lithography, the samples were manually cleaved, cleaned in acetone and isopropanol, baked for 20 minutes at 180 C, coated with 2 percent HSQ resist from Dow Corning Corporation, spun for two minutes at 1000 rpm, and baked for an additional 20 minutes. The samples were exposed at 5 nm step size, at 3500 μC/cm$^2$. The samples were developed in AZ 300 TMAH developer for 3 minutes, and etched on an Oxford Instruments PLC Plasmalab 100 with chlorine at 80 sccm, forward power at 50 W, ICP power at 800 W, 12 mTorr pressure, and 33 seconds of etch time. The samples were then implanted with phosphorous at normal incidence, 3 OkeV energy, and $1 \times 10^{14}$ ions/cm$^2$ density. The sample was annealed under a vacuum at 950 C in a Jipilec Jetstar rapid thermal annealer. The samples were dipped in buffered hydrofluoric acid in order to remove the remnants of electron beam resist from the surface.

After initial optical testing, the samples were coated with YLD 124 electro-optic polymer, and in one case with dendrimer-based electro-optic material. The samples were stored under a vacuum at all times when they were not being tested, in order to reduce the chances of any degradation.

Measurement Results

Optical Rectification Based Detection

Figure 12:
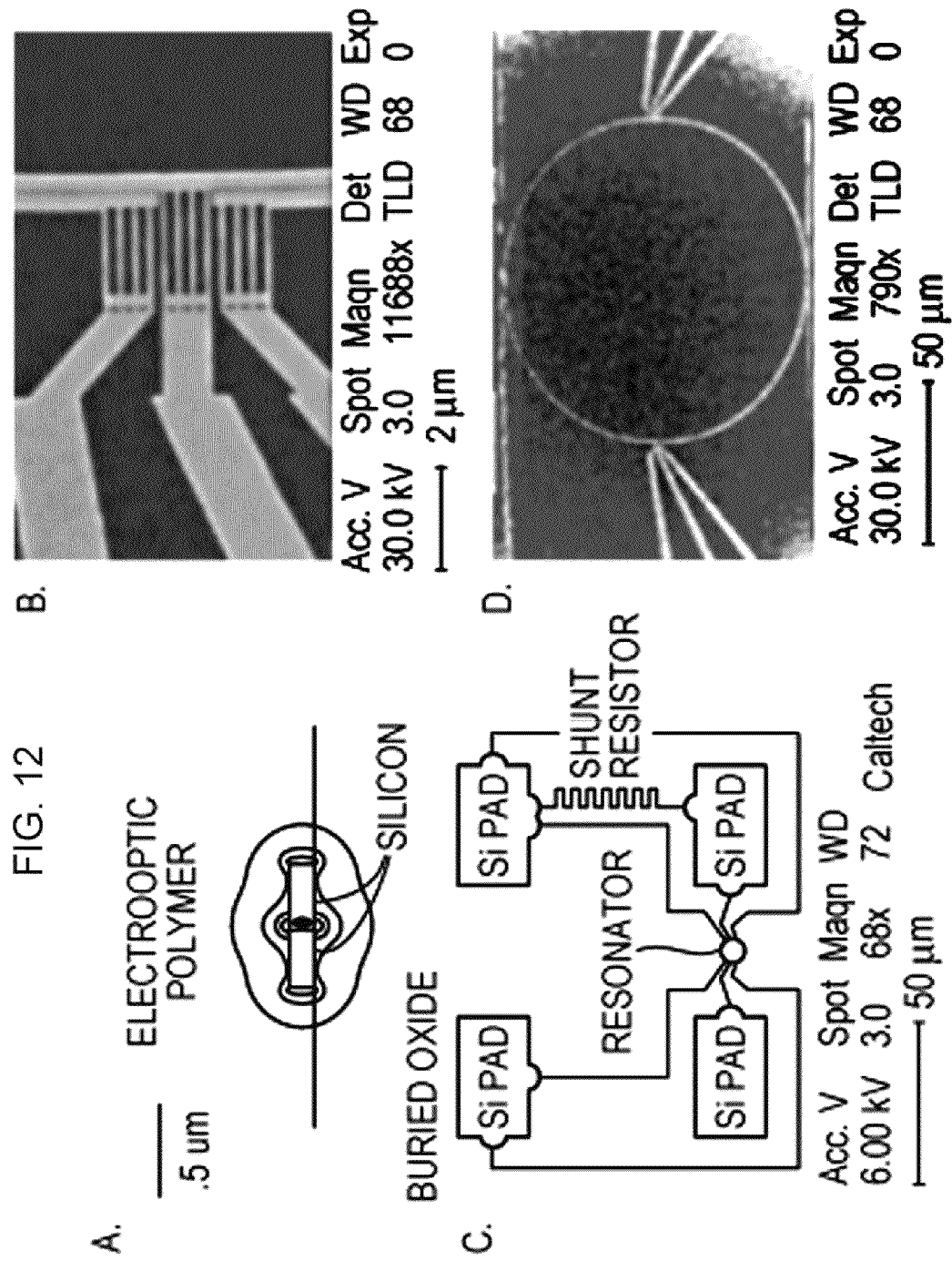
FIG. 12 is a four panel diagram that shows details of one embodiment of an optical modulator device, including the geometry of the photodetectors and filters, and including a cross section of the slotted waveguide.

FIG. 12 is a four panel diagram that shows details of one embodiment of an optical modulator device, including the geometry of the photodetectors and filters, and including a cross section of the slotted waveguide. Panel A of FIG. 12 shows a cross section of the device geometry with optical mode superimposed on a waveguide. In FIG. 12A, the optical mode was solved using a finite-difference based Hermetian Eigensolver, such as that described by A. Taflove, *Computational Electrodynamics*, (Artech House, Boston. Mass., 1995), and has an effective index of approximately 1.85 at 1500 nm. Most of the electric field is parallel to the plane of the chip, and it is possible to contact both sides of the slot in a slotted ring resonator, as shown in FIG. 12B, which shows a SEM image of the resonator electrical contacts. Electrically isolated contacts between the silicon rails defining the slotted waveguide introduce only about 0.1 dB of optical loss. FIG. 12C shows the logical layout of device, superimposed on a SEM image of a device. FIG. 12C details the layout of a complete slotted ring resonator, with two contact pads connected to the outer half of the ring, and two pads electrically connected to the inner half of the ring. A shunt resistor provides a means of confirming electrical contact, and typical pad-to-pad and pad-to-ring resistances range from 1 MΩ to 5 MΩ. FIG. 12D displays a typical electrically contacted slotted ring as presently described. FIG. 12D is an image of the ring and the electrical contact structures.

Measurements were performed with single-mode polarization maintaining input and output fibers, grating coupled to slotted waveguides with an insertion loss of approximately 8 dB. Optical signal was provided from an Agilent 81680A tunable laser and in some cases an erbium doped fiber amplifier ("EDFA") from Keopsys Corporation. A continuous optical signal inserted into a poled polymer ring results in a measurable current established between the two pads, which are electrically connected through a pico-Ammeter. In the most sensitive device, a DC current of ~1.3 nA was observed, indicating an electrical output power of ~$10^{-9}$ of the optical input power ($5\times10^{-12}$ W of output for approximately 0.5 mW coupled into the chip). Control devices, in which PMMA or un-poled EO material was substituted, show no photocurrent.

The fact that there is no external bias (or indeed any energy source) other than the optical signal applied to the system of this embodiment demonstrates conclusively that power is being converted from the optical signal. To establish that the conversion mechanism is actually optical rectification, we performed a number of additional measurements. A steady bias was applied to the chip for several minutes, as shown in Table 1A. A substantial change in the photoresponse of the device was observed. This change depends on the polarity of the bias voltage, consistent with the expected influence of repoling of the device in-place at room temperature. Specifically, if the external bias was applied opposing the original poling direction, conversion efficiency generally decreased, while an external bias in the direction of the original poling field increased conversion efficiency.

TABLE 1

Polling Results

Part A:

| Action | New Steady State Current (6 dBm input) |
|---|---|
| Initial State | −5.7 pA |
| +10 V for 2 minutes | 0 pA |
| −10 V for 2 minutes | −7.1 pA |
| +10 V for 2 minutes | −4.4 pA |
| +10 V for 4 minutes | −6.1 pA |
| −10 V for 4 minutes | −4.5 pA |
| −10 V for 2 minutes | −14.8 pA |

Part B:

| Device | Action | Current Polarity of Optical Rectification |
|---|---|---|
| 1 | Positive Poling | Positive |
| 1 | Thermal Cycling to poling temperature with no voltage | Rapid fluctuation, did not settle |
| 1 | Negative Poling | Negative |
| 2 | Negative Poling | Negative |
| 2 | Thermal Cycling to Poling temperature with no voltage | None observable |
| 2 | Positive Poling | Negative |
| 3 | Negative Poling | Negative |
| 4 | Positive Poling | Positive |
| 5 | Negative Poling | Negative |

To further understand the photo-conversion mechanism, 5 EO detection devices were poled with both positive and negative polarities, thus reversing the direction of the relative $\chi^2$ tensors. For these materials, the direction of $\chi^2$ is known to align with the polling E field direction, and we have verified this through Pockels' effect measurements. In all but one case, we observe that the polarity of the generated potential is the same as that used in poling, and the +V terminal during poling acts as the −V terminal in spontaneous current generation, as shown in Table 1B. Furthermore, the polarity of the current is consistent with a virtual voltage source induced through optical rectification. It was observed that these devices decay significantly over the course of testing, and that in one case the polarity of the output current was even observed to spontaneously switch after extensive testing. However, the initial behavior of the devices after polling seems largely correlated to the $\chi^2$ direction.

Part A of Table 1 shows the dependence of the steady state observed current after room temperature biasing with various voltage polarities for one device. The device was originally polled with a ~12 V bias, though at 110 C. With one exception, applying a voltage in the direction of the original polling voltage enhances current conversion efficiencies, while applying a voltage against the direction of the polling voltage reduces the current conversion efficiencies. It should be noted that the power coupled on-chip in these measurements was less than 1 mW due to coupler loss.

Part B of Table 1 shows the behavior of several different devices immediately after thermal polling or cycling without voltage. Measurements were taken sequentially from top to bottom for a given device. The only anomaly is the third measurement on device 2; this was after significant testing, and the current observed was substantially less than was observed in previous tests on the same device. We suspect that the polymer was degraded by repeated testing in this case.

Analysis of Data for Optical Rectification

To derive the magnitude of the expected photocurrent, we assume that the $\chi^2$ magnitude relating to the Pockels' effect is similar to that for optical rectification. A measurement of $\chi^2$ can then be obtained from the direct observation of the electro-optic coefficient by the standard measurements described earlier. The typical measured tuning value of 2 GHz/V yields approximately 50 μm/V.

In the best case, devices with 6 dBm of input power returned approximately 1.4 nA of current. With Qs ranging from 3 k to 5 k, and assuming approximately 7 dB of insertion loss in the input grating coupler on one of our chips, in the best case as much as 0 dBm might be circulating in a resonator on resonance. This implies a peak electric field due to the optical signal of approximately $3.1\times10^6$ V/m. The induced static nonlinear polarization field is then nearly 1000 V/m, which amounts to a voltage drop of $14\times10^{-5}$ V across a 140 nm gap. If this voltage is assumed to be perfectly maintained, and the load resistance is assumed to be 5 MΩ, then 28 pA would be generated, about a factor of 100 less than is observed in the largest measurement made, but within a factor of 20 of the typical measurement of 352 pA for 6 dBm of input. Significantly, because the generated current is quadratic in E, it is clear that the current will be linearly proportional to the input intensity. This is in accordance with our observations. The best results for optical rectification were obtained with YLD 124/APC polymer, whereas our best Pockels' Effect results were obtained with the dendrimer materials.

Significantly, the sign of the output current matches that which would be predicted by nonlinear optical rectification, as discussed above. Specifically, since positive current emanates from the positive terminal, the rectified E field has a sign reversed from the $\chi^2$ and the polling E field. It is well established that the $\chi^2$ direction tends to align with the direction of the polling E field. Because of this, the rectified field acting as a voltage source will produce an effective positive terminal at the terminal that had the positive polling voltage.

We do not yet fully understand the current generation mechanism. In particular, it is not clear what provides the mechanism for charge transport across the gap. The APC material in which the nonlinear polymer is hosted is insulating, and though it does exhibit the photoconductivity effect due to visible light, it is unclear whether it can for near-infrared radiation. Photoconductivity due to second harmonic generation may play a role in this effect. It is certainly the case, however, that current flows through this gap; that is the only region in the entire system where an electromotive force exists. Also, photoconductivity alone is not adequate to explain the reversal of the current coming from the detector devices when the poling direction is reversed, nor the conversion of the optical input into directed current in general. The only mechanism to our knowledge that adequately explains this data is optical rectification.

If we assume that it will be possible to achieve a 10-fold improvement in the Q's of the resonators, while still getting more than 10 dB of extinction, then the intensity circulating in such a ring would be about 13 dB up from the intensity of the input wave. By comparison, with a Q of about 1000 and high extinction, the peak circulating intensity is about the same as the intensity in the input waveguide. Therefore, it is reasonable to expect that it will be possible to get at least 10 dB of improvement in the circulating intensity, and thus in the conversion efficiency, by fabricating higher Q rings.

By combining the nano-scale slotted waveguide geometry with electro-optical polymers having high nonlinear constants, we have obtained massive enhancement of the optical field. That has in turn enabled us to exploit nonlinear optical processes that are typically only available in the kW regime in the sub-mW regime. This difference is so considerable that we believe it represents a change in kind for the function of nonlinear optical devices. In addition, it is believed that this hybrid material system provides systems and methods for creating compact devices that exploit other nonlinear phenomena on-chip.

Optical rectification based detectors can have many advantages over currently available technology. In particular, such detectors are expected to function at a higher intrinsic rate than the typical photodiode in use, as the optical rectification process occurs at the optical frequency itself, on the order of 100 THz in WDM systems. The absence of an external bias, and the generation of a voltage rather than a change in current flow, both provide certain advantages in electronic operation. We also believe that a device based on nonlinear optical rectification will not suffer from the limitation of a dark current. This in turn can provide WDM systems that will function with lower optical power, providing numerous benefits. Similarly, our demonstration of enhanced modulation using these waveguide geometries provides useful components for future communications systems.

We believe that there will be advantageous economic aspects of such devices in various embodiments. Because our devices can be fabricated in planar electronics grade silicon-on-insulator, using processes compatible with advanced CMOS processing, it is expected that devices embodying these principles will be less expensive to fabricate.

Optical Modulators

Optical modulators are a fundamental component of optical data transmission systems. They are used to convert electrical voltage into amplitude modulation of an optical carrier frequency, and they can serve as the gateway from the electrical to the optical domain. High-bandwidth optical signals can be transmitted through optical fibers with low loss and low latency. All practical high-speed modulators that are in use today require input voltage shifts on the order of 1V to obtain full extinction. However it is extremely advantageous in terms of noise performance for modulators to operate at lower drive voltages. Many sensors and antennas generate only millivolts or less. As a result it is often necessary to include an amplifier in conventional optical transmission systems, which often limits system performance. By using silicon nano-slot waveguide designs and optical polymers, it is possible today to construct millivolt-scale, broadband modulators. In some embodiments, a millivolt-scale signal is one having a magnitude in the range of hundreds of millivolts down to units of millivolts. Using novel nanostructured waveguide designs, we have demonstrated a 100× improvement in $V\pi$ over conventional electro-optic polymer modulators.

A variety of physical effects are available to produce optical modulation, including the acousto-optic effect, the Pockels effect either in hard materials, such as lithium niobate or in electro-optic polymers, free-carrier or plasma effects, electro-absorption, and thermal modulation. For many types of optical modulation, the basic design of a modulator is similar; a region of waveguide on one arm of a Mach-Zehnder interferometer is made to include an active optical material that changes index in response to an external signal. This might be, for instance, a waveguide of lithium niobate, or a semiconductor waveguide in silicon. In both cases, a voltage is introduced to the waveguide region by means of external electrodes. This causes the active region to shift in index slightly, causing a phase delay on the light traveling down one arm of the modulator. When the light in that arm is recombined with light that traveled down a reference arm, the phase difference between the two signals causes the combined signal to change in amplitude, with this change depending on the amount of phase delay induced on the phase modulation arm. Other schemes, where both arms are modulated in order to improve performance, are also common.

Figure 13:
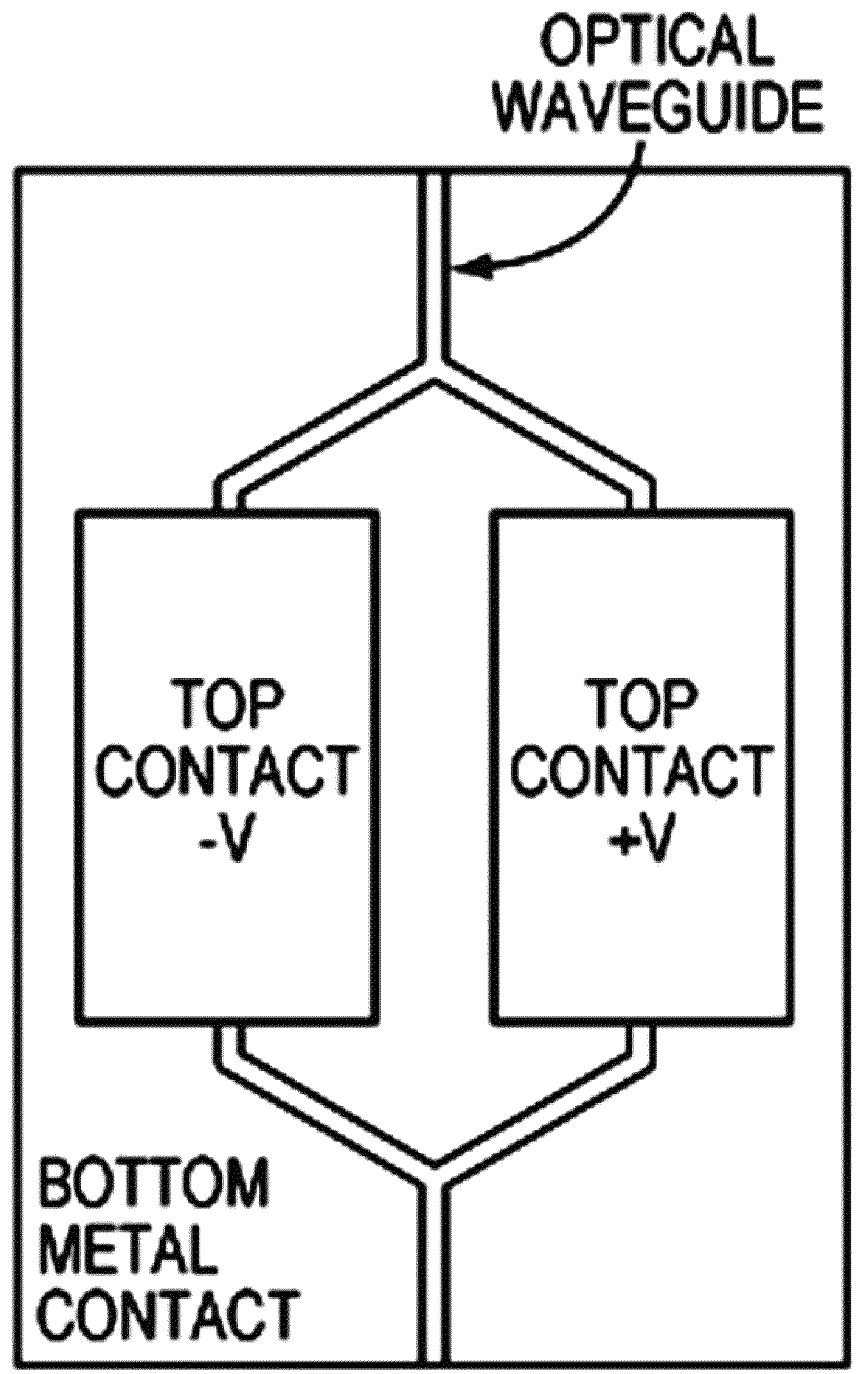
FIG. 13 shows a diagram of a Mach-Zehnder modulator with a conventional electrode geometry in top-down view, including top contact, waveguide, and bottom contact layers.

The measure of the strength of a modulation effect is how much phase shift is obtained for a given input voltage. Typical conventional modulators obtain effective index shifts on the order of 0.004% for 1 V. This implies that a Mach-Zehnder 1 cm in length, meant to modulate radiation near 1550 nm, would require 1 V of external input for the arms to accumulate a relative phase shift of radians. The half wave voltage $V_\pi$ (or $V_{pi}$) is the voltage needed for an interarm phase shift of $\pi$ radians (or 180 degrees). Lower values for $V_\pi$ imply that less power is needed to operate the modulator. Often, the responsivity, a length-independent product $V_\pi$-L is reported. Typical $V_\pi$-L values are in the range of 8 Vcm in silicon, or 6 V-cm for lithium niobate modulators. This voltage-length product, or responsivity, is an important figure of merit for examining a novel modulator design. Making a modulator physically longer generally trades lower halfwave voltage against reduced operating frequency and higher loss. Because generating high-speed and high-power signals requires specialized amplifiers, particularly if broadband performance is required, lowering the operating voltage of modulators is extremely desirable, particularly for on-chip integrated electronic/photonic applications, (including chip-to-chip interconnects) where on-chip voltages are limited to levels available in CMOS. FIG. 13 shows a diagram of a Mach-Zehnder modulator with a conventional electrode geometry.

FIG. 13 is a top-down view of a simple conventional Mach-Zehnder polymer interferometer, showing top contact, waveguide, and bottom contact layers. Such a device is usually operated in 'push/pull' mode, where either opposite voltages are applied to the different arms, or where the two arms are poled in opposite directions to achieve the same effect.

In the past several years, silicon has gained attention as an ideal optical material for integrated optics, in particular at telecommunications wavelengths. Low loss optical devices have been built, and modulation obtained through free carrier effects. One of the waveguides that can be supported by silicon is the so-called slot waveguide geometry. This involves two ridges of silicon placed close to each other, with a small gap between them. We have demonstrated modulation regions based on filling this gap with a nonlinear material, and using the two waveguide halves as electrodes. In such a geometry, the silicon is doped to a level that allows electrical conductivity without causing substantial optical losses. This allows the two wires or ridges to serve both as transparent electrical contacts and as an optical waveguide.

Using slot waveguides, we previously obtained an improvement in modulation strength of nearly 5× when compared to the best contemporary conventional waveguide geometries with electrodes separated from the waveguide, with the initial, non-optimized designs. This improvement was based on the remarkably small width of the gap across which the driving voltage drops. It is expected that smaller gaps translate into higher field per Volt, and the Pockels Effect depends on the local strength of the electric field. The smaller the gap, the larger the index shift. A unique property of slot waveguides is that, even as these gaps become nanoscale, the divergence conditions on the electric field require that much of the optical mode remains within the central gap. As a result, changing the index within a nanoscale gap can give a remarkably large change in the waveguide effective index. Because of these divergence conditions, the optical mode's effective index is largely determined by the shift found even in very small gaps.

Low $V_\pi$ Modulators

Several major approaches toward achieving low $V_\pi$ modulation have recently been pursued. The free-carrier dispersion effect in silicon waveguides has been used. Green et al. achieved a $V_\pi$ of 1.8 V with this effect. Modulators based on lithium niobate are also frequently used. Typical commercially obtained $V_\pi$ values are 4 V. Recently, Mathine and co-workers have demonstrated a nonlinear polymer based modulator with a $V_\pi$ of 0.65 V. For the devices produced by others, the attained values of $V_\pi$ are large.

A number of approaches have been proposed for developing low $V_\pi$ modulators. Different proposed approaches rely the development of new electrooptic materials, or on optical designs that trade bandwidth for sensitivity, either through the use of resonant enhancement, or through dispersion engineering. The designs presented herein are based upon conventional, high-bandwidth Mach-Zehnder traveling wave approaches, but achieve appreciable benefits from using nano-slot waveguides. Of course, these designs can also take advantage of the newest and best electrooptic polymers. In principle, any material that can be coated conformally onto the surface of the silicon waveguides and that is reasonably resistive could be used to provide modulation in these systems, making the system extremely general.

The most recent nonlinear polymers achieve a high nonlinear coefficient, expressed as an $r_{33}$ of 500 pm/V. Using this in combination with the high susceptibilities described above, it is believed that it is possible today to construct a 1 cm Mach-Zehnder modulator with a $V_\pi$ of 8 mV. This corresponds to a ring resonator with a tuning sensitivity of 795 GHz/V. Both of these values are two orders of magnitude better than the performance obtained by current approaches. Current commercially available modulators typically have $V_\pi$'s from 1 to 9 V, and current tunable electro-optic polymer based resonators achieve 1 GHz/V of tunability. If the $r_{33}$ value of 33 pm/V demonstrated by Tazawa and Steier for conventional polymer designs is used, then a $V_\pi$ of 64 mV and a resonator tunability of 50 GHz/V are obtained.

Segmented waveguide contact structures can be formed that allow very low resistance electrical contact to slot waveguides. We have described above, in similar circumstances, electrical contact to waveguides can be established via segmented waveguides. See FIG. 12B and FIG. 12D and the discussion related thereto. When the RC circuits implied by the segmentation geometry and the gap are examined, it is found that RC turn on times on the order of 200 GHz or more are achievable. Because the nonlinear polymers exhibit an ultrafast nonlinearity, these waveguide geometries present a path to making Terahertz scale optical modulators. Because the modulation is so strong, it is also possible to trade the length of the modulator against $V_\pi$. For example, our optimal geometry is expected obtain a $V\pi$ of 0.6 V with a 100 μm long Mach-Zehnder modulator. This device is expected be exceptionally simple to design for 10 GHz operation, as it could likely be treated as a lumped element. We have shown above that lateral contact structures with low loss and low resistance can be constructed with these slot waveguides. See FIG. 12B and FIG. 12D and the discussion related thereto.

We believe these nano-slot waveguide designs present a path to realizing very high speed, low voltage modulators. It is advantageous to be able to attain a responsivity $V_\pi$–L of less than 1 V-cm. The physical principles involved in such devices are based on employing a nonlinear material of at least moderate resistivity, and a high index contrast waveguide with tight lithographic tolerances. Therefore, it is expected that nano-slot waveguides, either as Mach-Zehnder or ring-based devices, are likely an advantageous geometry for optical modulation with nonlinear materials in many situations. In addition, materials compatibility and processing issues are greatly reduced for such devices compared to conventional multilayer patterned polymer modulator structures.

These high index contrast devices have (or are expected to have) extremely small bend radii, which are often orders of magnitude smaller than corresponding all-polymer designs with low loss and high Q. These geometric features translate into extremely high free spectral ranges for ring modulators, compact devices, and wide process latitudes for their fabrication. Given the inexpensive and readily available foundry SOI and silicon processes available today, and the commercial availability of electron beam lithography at sub-10 nm line resolution, it is expected that slot-waveguide based modulators are likely to replace conventional modulators in many applications in the coming years.

Waveguide Geometries

Figure 14:
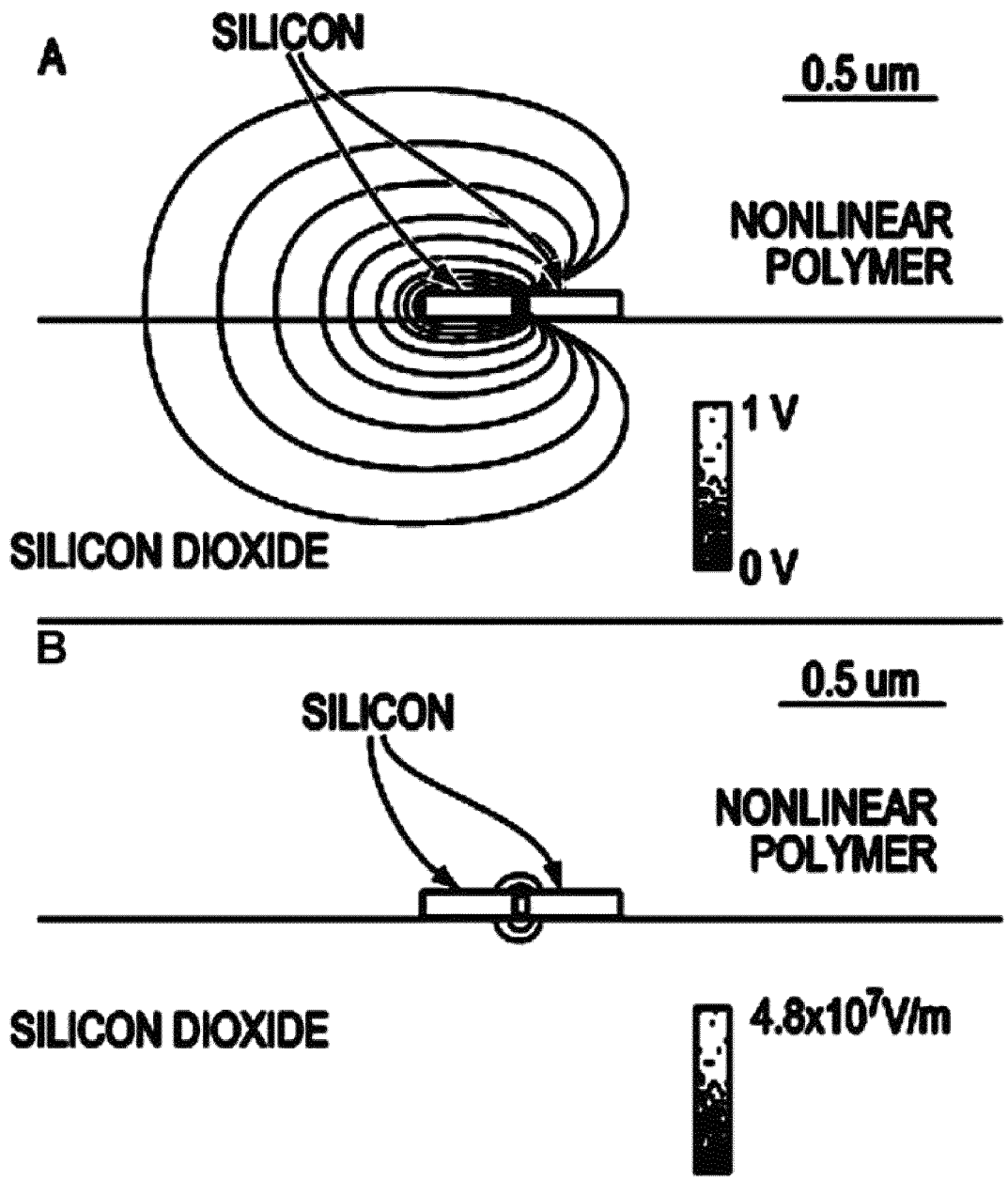
FIG. 14A shows the static voltage potential field distribution due to charging the two electrodes.
FIG. 14B shows the electric field due to the potential distribution. |E| is plotted in increments of 10%.

We now describe several different waveguide geometries, and show the effective index susceptibility as a function of the slot sizes of the waveguide. The susceptibilities are calculated near a 1550 nm free space wavelength. However, the values obtained will not vary much from 1480 nm to 1600 nm as the modal pattern does not change significantly. In the embodiments described, the waveguides are composed of silicon, and assumed to rest on a layer of silicon dioxide. The top cladding is a nonlinear polymer with an index of 1.7. This is similar to the waveguide geometry that we have used in our modulation work described hereinabove. FIG. 14 shows the static electric fields solved as part of analyzing waveguide design 1 with a gap of 40 nm, as described in Table 2. As one would expect, the field is nearly entirely concentrated inside the slot area. The field shown was calculated assuming a voltage difference of 1 Volt. It is slightly larger than simply the reciprocal of the gap size due to the singular nature of the solution to Poisson's equation near the corners of the waveguide.

FIG. 14A and FIG. 14B illustrate solved field patterns for the analysis of waveguide 1 at a 40 nm gap. FIG. 14A shows the static voltage potential field distribution due to charging the two electrodes. FIG. 14B shows the electric field due to the potential distribution. |E| is plotted in increments of 10%.

We have constrained ourselves to use waveguide geometries that have minimum feature sizes of at least 20 nm. These are near the minimum feature sizes that can be reliably fabricated using e-beam lithography. Table 2 lists a description of each type of waveguide studied. Each waveguide was studied for a number of different gap sizes. In all cases, the maximum susceptibility was obtained at the minimum gap size. The maximum gap size studied and the susceptibility at this point are also listed. In some cases, the study was terminated because at larger gap sizes, the mode is not supported; this is noted in Table 2. For multislot waveguide designs where there are N arms, there are N–1 gaps; the design presumes that alternating arms will be biased either at the input potential or ground.

Table 2 shows the effective index susceptibility for various waveguide designs. The susceptibility is approximately inversely proportional to gap size.

It is clear that within the regime of slotted waveguides, it is always advantageous to make the slot size smaller, at least down to the 20 nm gap we have studied. This causes the DC electric field to increase, while the optical mode tends to migrate into the slot region, preventing any falloff due to the optical mode failing to overlap the modulation region.

TABLE 2

| Waveguide Design | Waveguide Height (nm) | Arm Sizes (nm) | Maximum $\gamma$ ($\mu m^{-1}$) | Minimum $\gamma$ ($\mu m^{-1}$) |
|---|---|---|---|---|
| 1 | 100 | 300, 300 | 1.3, 20 nm gap | .40, 140 nm gap |
| 2 | 150 | 300, 300 | 1.6, 20 nm gap | .68, 120 nm gap |
| 3 | 200 | 300, 300 | 2.3, 20 nm gap | .74, 120 nm gap |
| 4 | 100 | 400, 400 | 1.1, 20 nm gap | .67, 60 nm gap, modal limit |
| 5 | 100 | 250, 250 | 1.2, 20 nm gap | .56, 60 nm gap, modal limit |
| 6 | 100 | 300, 40, 300 | 1.6, 20 nm gap | .53, 80 nm gap, modal limit |
| 7 | 100 | 300, 40, 40, 300 | 1.9, 20 nm gap | .76, 60 nm gap, modal limit |
| 8 | 200 | 200, 40, 200 | 3, 20 nm gap | 1.4, 60 nm gap, modal limit |
| 9 | 300 | 300, 300 | 2.5, 20 nm gap | 2.5, 20 nm gap, modal limit |
| Steier et al. | N/A | N/A | .026, 10 $\mu$m gap | N/A |

In examining the results of our calculations, it is useful to calculate the maximum susceptibilities that can be obtained. For an effective index of about 2, which is approximately correct for these waveguides, and a gap size of 20 nm, the maximum achievable $\gamma$ is approximately 12.5 $\mu m^{-1}$. Thus, for a gap size of 20 nm, waveguide design 8 is already within 25% of the theoretical maximum value.

It is also worth noting the corresponding $\gamma$ value that can be obtained by calculation using our methods for the separated electrode approach of Steier. The effective index of the mode is expected to be about 1.8, and the gap distance for the dc field is 10 um. Under the most optimistic assumptions about mode overlap with the active polymer region (that is, assuming complete overlap), this corresponds to a $\gamma$ of about 0.03 $\mu m^{-1}$.

It is useful to calculate, given the current $r_{33}$ values that are available, the index tuning that might be achieved with these designs. The most advanced polymers now yield $r_{33}$ values of 500 pm/V. If a bulk refractive index of 1.7 is used, then a $\partial n/\partial V$ of 0.006 $V^{-1}$ is obtained with the best design given above. Using a waveguide with an effective index of 2 and a group index of 3, which are typical of silicon-polymer nano-slot waveguides, the $V_\pi$ for a Mach-Zehnder with a length of 1 cm is expected to be about 6 mV. The resonance shift that is expected to be obtained in a ring resonator configuration would be 380 GHz per volt. Both of these values represent orders of magnitude improvement in the performance of these devices compared to current designs.

Segmented Contacting

As we have shown empirically, silicon can be doped to about 0.025 Ω-cm of resistivity with a n-type dopant without substantially increasing losses. Other dopants or perhaps other high index waveguiding materials may have even higher conductivities that can be induced, without significantly degrading optical performance. However, it is known that the conductivity cannot be increased endlessly without impacting optical loss.

This naturally presents a serious challenge for the issue of driving a slot waveguide of any substantial length. Consider a slot waveguide arm of length 1 mm, formed of our optimal design. The capacitor formed by the gap between the two electrodes is about 0.25 pF. The 'down the arm' resistance of the structure, however, is 4 MΩ. Therefore, the turn on time of an active waveguide based on this is about 0.1 μS, implying a 10 MHz bandwidth.

A solution to this problem is presented by continuously contacting the waveguide via a segmented waveguide. This comprises contacting the two silicon ridges with a series of silicon arms. Even though the silicon arms destroy the continuous symmetry of the waveguide, for the proper choice of periodicity no loss occurs, and the mode is minimally distorted. This is because a Bloch mode is formed on the discrete lattice periodicity, with no added theoretical loss. Of course the performance of fabricated devices will be different from that of conventional slot waveguides due to fabrication process differences. We have previously demonstrated empirically that continuous electrical contact can be formed for non-slotted waveguide via segmentation with relatively low optical losses.

Figure 15:
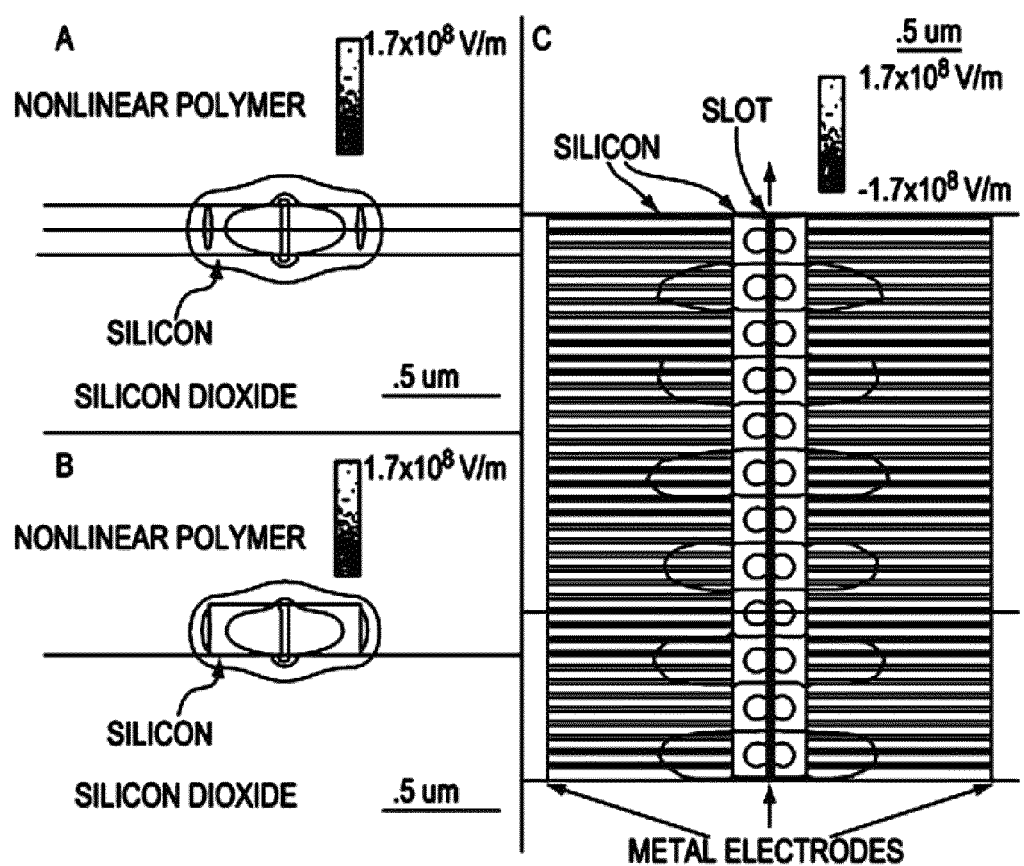
FIG. 15A shows a cross section of the segmented, slotted waveguide, with the |E| field plotted in increments of 10% of max value.
FIG. 15B shows a similar plot for the unsegmented waveguide.
FIG. 15C shows a horizontal cross section of the segmented, slotted waveguide in which Re(Ex) is plotted in increments of 20% of max.

Here we present a simulation of a particular segmentation geometry for our optimal slot waveguide design, that with 200 nm tall and 300 nm wide arms and a gap of 20 nm. We have found that a segmentation with 40 nm arms, and a periodicity of 100 nm, appears to induce no loss or significant mode distortion in the waveguide. Around 2 um of clearance appears to be needed from the edge of the segmented waveguide to the end of the arms. FIG. 15A, FIG. 15B and FIG. 15C show plots of several cross sections of the segmented slot waveguide with a plot of the modal pattern overlaid. For comparison, a cross section of the unsegmented slot waveguide is presented as well. Simulations were also performed to confirm that the index shift formula continued to apply to the segmented slotted waveguide. It was found that the index shift was in approximate agreement with the value predicted for the non-segmented case. Non-segmented mode-solvers were used for the rest of the simulations in this work, because simulation of the segmented designs is radically more computationally burdensome than solving for the unsegmented case, as they require solving for the modes of a 3d structure. Since the index shifts for the unsegmented and segmented cases are extremely similar, solving for the modes in the unsegmented cases is adequate for purposes of design and proof-of-concept.

FIG. 15A shows a cross section of the segmented, slotted waveguide, with the |E| field plotted in increments of 10% of max value. FIG. 15B shows a similar plot for the unsegmented waveguide. FIG. 15C shows a horizontal cross section of the segmented, slotted waveguide; Re(Ex) is plotted in increments of 20% of max. In an actual device, some sort of metal based transmission line would undoubtedly provide the driving voltage for the waveguide. The metal electrodes that would likely form part of this transmission line have been noted in FIG. 15C. In all cases the mode has been normalized to have 1 Watt of propagating power. FIG. 15A and FIG. 15C show the location of the other respective cross section as a line denoted C in FIG. 15A and A in FIG. 15C.

Assuming a 0.025 Ω-cm resistivity, one can calculate the outer arm resistance as 63 kΩ per side per period, while the inner arm resistance is 25 kΩ per side per period. The gap capacitance per period is $2.5 \times 10^{-17}$ Farads. This implies a bandwidth on the order of 200 GHz.

We now describe an electro-optic modulator fabricated from a silicon slot waveguide and clad in a nonlinear polymer. In this geometry, the electrodes form parts of the waveguide, and the modulator driving voltage drops across a 120 nm slot. As a result, a half wave voltage of 0.25 V is achieved near 1550 nm. This is one of the lowest values for any modulator obtained to date. As the nonlinear polymers are extremely resistive, our device also has the advantage of drawing almost no current. It is believed that this type of modulator could operate at exceedingly low power.

A unique advantage with nonlinear polymers is that an integrated optical circuit can be conformally coated by a nonlinear polymer. This property, when combined with a slot waveguide, enables the construction of a uniquely responsive modulator. We describe the use of a push-pull Mach-Zehnder modulator configuration in which each arm has an opposing bias, leading to an opposing phase shift.

Figure 16:
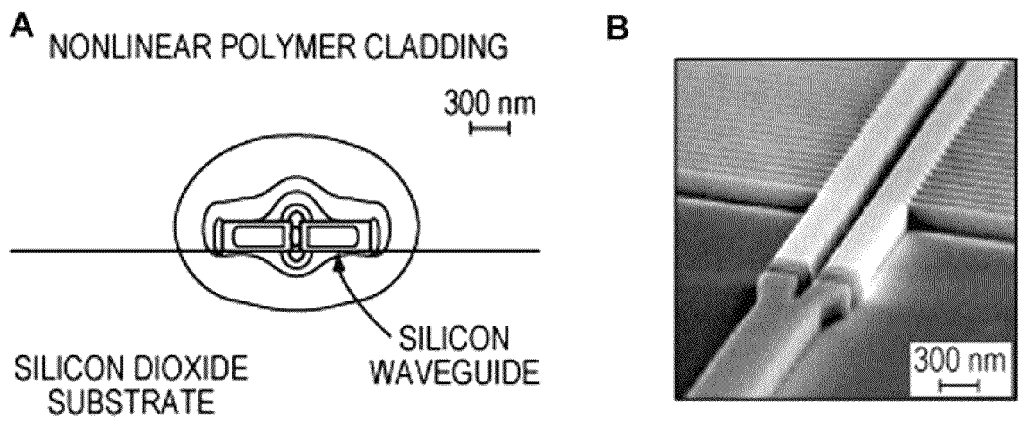
FIG. 16A is a diagram of the silicon slot waveguide used in the Mach-Zehnder modulator, according to principles of the invention.
FIG. 16B is an SEM micrograph of a slot waveguide, according to principles of the invention.

FIG. 16A shows the slot waveguide used for the Mach-Zehnder modulator. The modal pattern near 1550 nm is plotted, and contours of |E| are shown. FIG. 16B is an SEM micrograph of a slot waveguide. In this case, the slot waveguide is being coupled to with a ridge waveguide; this mode converter involves tiny gaps which ensure electrical isolation between the two arms. Contacting arms are also present around 3 μm from the ridge/slot junction. The dimensions are two 300×100 nm arms separated by a 120 nm slot.

Nonlinear polymers typically have very high resistivity of $10^{11}$ Ωcm. As a result, the two silicon arms are electrically isolated and can be used as modulator electrodes. The voltage drop between the arms occurs across a 120 nm electrode spacing, as opposed to the 5-10 μm that is typically required for modulators involving a nonlinear polymer and metallic contacts. This is a fundamental advantage that slot waveguide geometries have for electro-optic modulation.

It is advantageous to contact the silicon arms with an external electrode throughout the length of the Mach-Zehnder device to minimize parasitic resistances. We use a segmented waveguide in which a periodic set of small arms touches both waveguide arms. We use a segmentation with a periodicity of 0.3 μm and arm size of 0.1 μm that is largely transparent to the optical mode.

Figure 17:
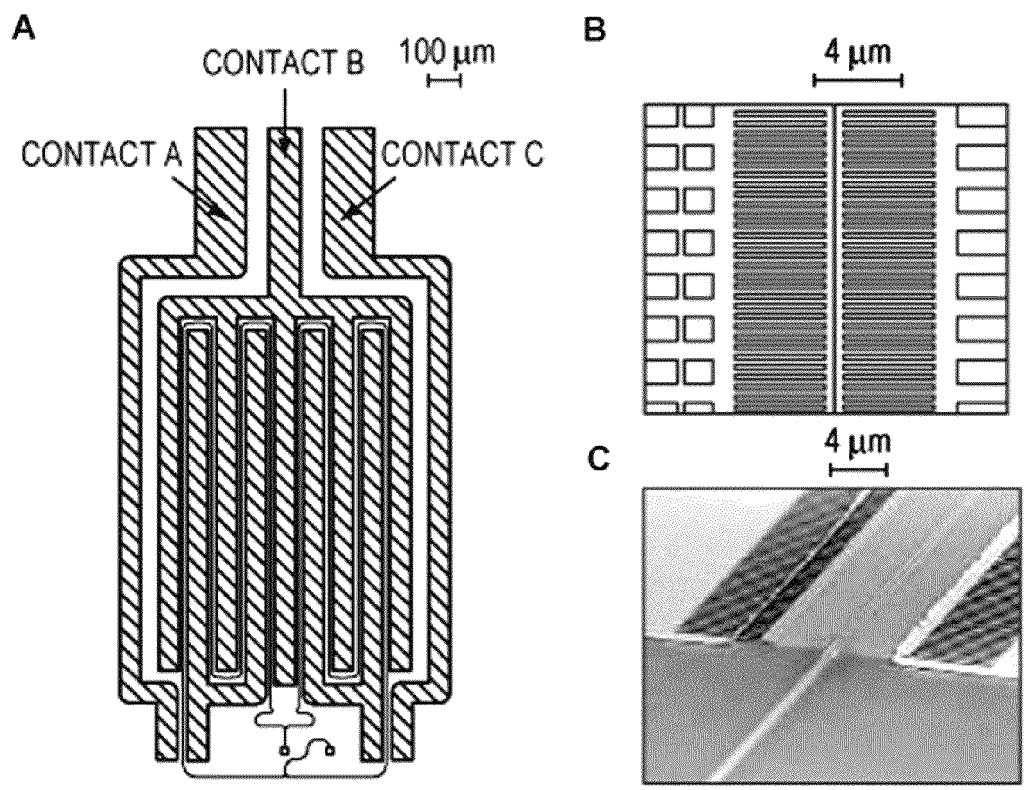
FIG. 17A is a diagram of the modulator layout, according to principles of the invention.
FIG. 17B and FIG. 17C are two SEM micrographs of modulators constructed according to principles of the invention, that show the slotted, segmented region, as well as the location where the silicon makes contact with the electrical layer.

Because the polymer has a second order nonlinearity, a Mach-Zehnder modulator can be operated in push-pull mode, even with no dc bias, effectively doubling the modulator response. FIG. 17A is a diagram of the modulator layout, in which contacts A, B, and C are shown. FIG. 17B is a diagram and FIG. 17C is a SEM micrograph that show the slotted, segmented region, as well as the location where the silicon makes contact with the electrical layer.

Referring to FIG. 17A, there are three regions in the modulator that are capable of maintaining distinct voltages. During poling operation, contact A is given a voltage of $2V_{pole}$, contact B a voltage of $V_{pole}$, and contact C is held at ground. To achieve a poling field of 150 V/μm, $V_{pole}$ was 18 V. This has the effect of symmetrically orienting the polymer in the two Mach-Zehnder arms. During device operation, contact B is driven at the desired voltage, while contacts A and C are both held at ground, leading to asymmetric electric fields in the two arms for a single bias voltage. This is the source of the asymmetric phase response. Electrical regions A and C cross the waveguide by means of a slotted ridged waveguide. At the ridge to slot mode converter, a small gap is left that maintains electrical isolation but is optically transparent. This enables the device to be built without requiring any via layers. A driving voltage from a DC voltage source was applied to contact B, while contacts A and C were held at ground.

Figure 18:
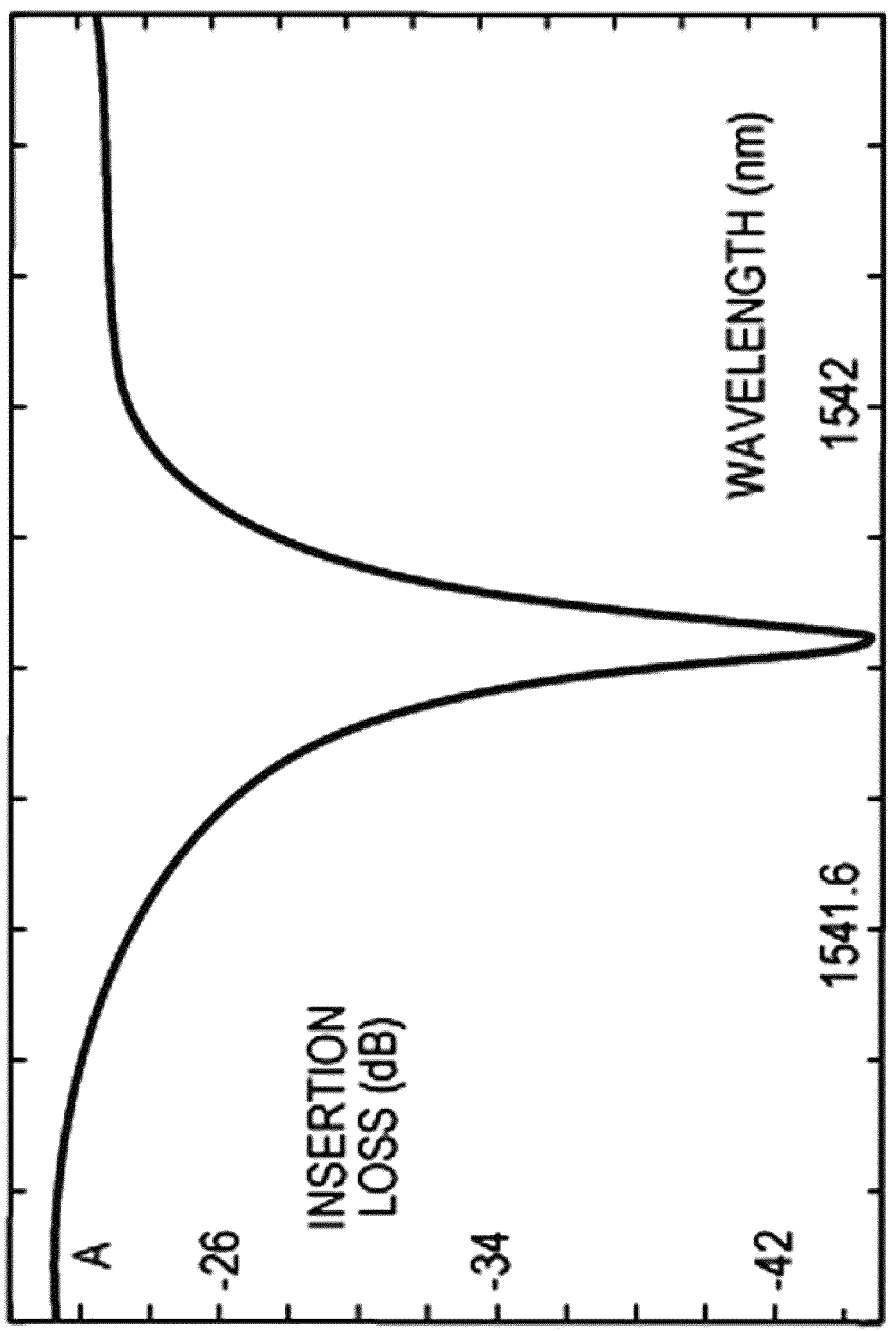
FIG. 18 is a diagram that shows a transmission spectrum of an electroded slot waveguide resonator with a gap of 70 nm. Fiber to fiber insertion loss is plotted in dB, against the test laser wavelength in nm.

We have recently demonstrated empirically that slot sizes of around 70 nm can be fabricated in 110 nm SOI as ring resonators with electrical contacts. FIG. 18 is a diagram that shows a transmission spectrum of an electroded slot waveguide resonator with a gap of 70 nm. Fiber to fiber insertion loss is plotted in dB, against the test laser wavelength in nm. We have also confirmed through electrical measurements that the two halves of the slots are largely electrically isolated.

We believe that there is the possibility of constructing even narrower slot waveguides, on the scale of 1-5 nm in thickness. For example, one could use epitaxial techniques to grow a horizontal slot structure (rather than the vertical structures we have explored thus far) with an active, insulating material, with silicon beneath and above. This could be done in a layer form analogous to SOI wafer technology, in which a very thin layer of electroactive material such as the polymers we have described herein could be introduced. Such structures offer the possibility of yet another order of magnitude of improvement in the low-voltage performance of modulators. We anticipate our slot structures to be fairly robust even in the presence of fabrication errors. Fabrication imperfections may cause some of the narrower slots to have tiny amounts of residual silicon or oxide in their centers, or to even be partially fused in places. As long as electrical isolation is obtained, and the optical loss is acceptable, we would expect the slot performance to decrease only in a linear proportion to the amount of the slot volume that is no longer available to the nonlinear polymer cladding.

The description provided herein may be augmented by the descriptions provided in the following patents and pending patent applications: U.S. Pat. Nos. 7,200,308, 7,424,192, U.S. Patent Application Publication No. 2009/0022445A1, U.S. patent application Ser. No. 12/167,063, PCT/US2009/33516, and PCT/US2009/36128.

We now describe herein a hyperspectral imaging device built on a photonic integrated circuit. Target wavelengths of the hyperspectral imaging device range from the visible wavelengths to the mid-infrared and longer wavelengths. It is contemplated that the devices described can be implemented using silicon-on-insulator technology. In other embodiments, fabrication can be done in any other suitable material fabrication technology. In some embodiments, the device can comprise several stacked layers of optically active substrates.

In one embodiment, the substrate is a photonic integrated circuit which includes a plurality of pixels of photonic circuit elements configured to provide an image. Each imaging pixel photonic circuit includes an input coupler that accepts broadband input electromagnetic radiation (e.g., visible light and/or infrared light) and optically couples the input electromagnetic radiation by way of a waveguide to a plurality of wavelength filters that separate out specific wavelength components or ranges of wavelengths. Different imagining elements connected to each input coupler detect specific wavelengths of electromagnetic radiation to provide a measure of the spectral content of the electromagnetic radiation impinging on the input coupler to which they are connected. A plurality of pixels of photonic circuit elements can be formed into an M×N array to provide an imaging capability, where M and N are integers.

The wavelength filters for each pixel can comprise any suitable filter. In some embodiments, ring resonators can be used for very narrow sampling ranges of the broadband input electromagnetic radiation. In other embodiments, Mach-Zehnder devices can be used for sampling ranges that are wider in wavelength. The wavelength filters can be made tunable in real-time by virtue of any suitable on-chip tuning technique known in the art. Multiple wavelength filtered light modes can be directed to multiple high-speed integrated photodetectors. The integrated photodetectors convert the filtered light at each specific filtered wavelength or range of wavelengths into an electrical signal representative of the intensity light passing the respective wavelength filter for further signal processing.

Figure 19B:
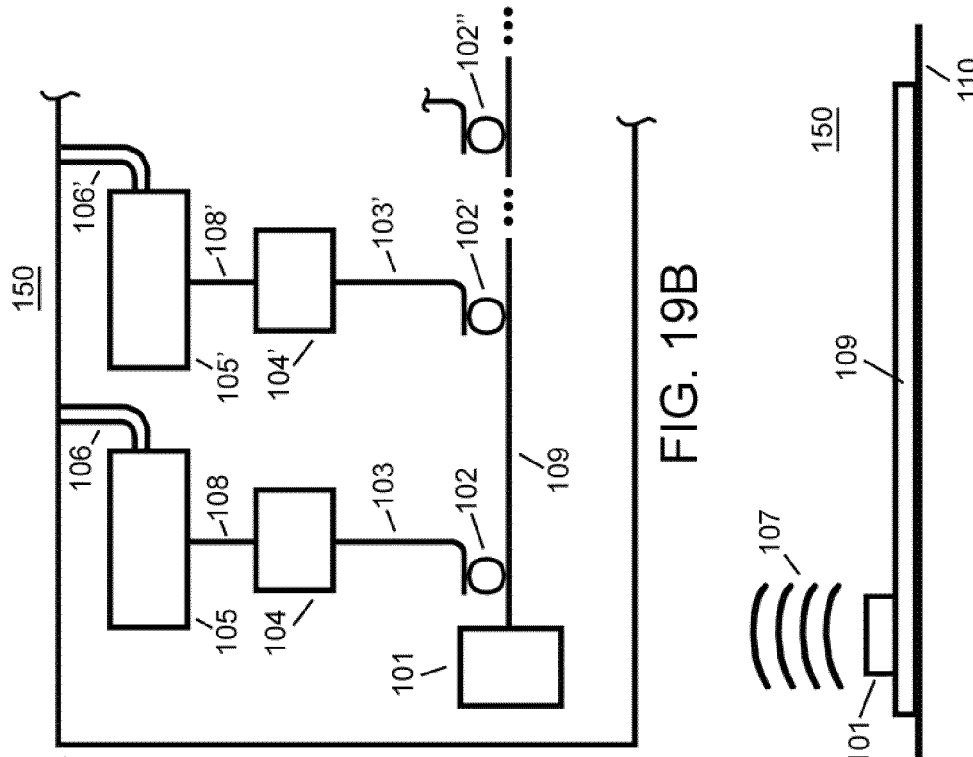
FIG. 19B is a drawing that shows a single pixel of an exemplary embodiment of the hyperspectral imaging photonic integrated circuit shown in FIG. 19A.
Figure 19C:
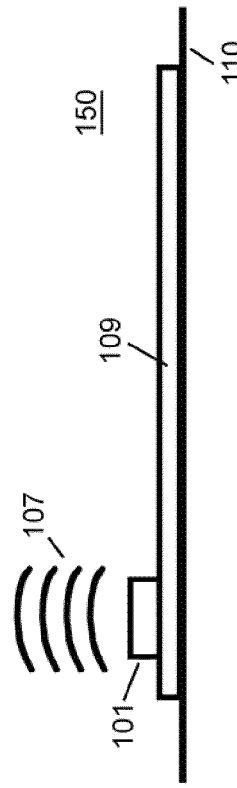
FIG. 19C is a drawing that shows a side view of an exemplary embodiment of a single pixel of the hyperspectral imaging photonic integrated circuit shown in FIG. 19A.
Figure 19A:
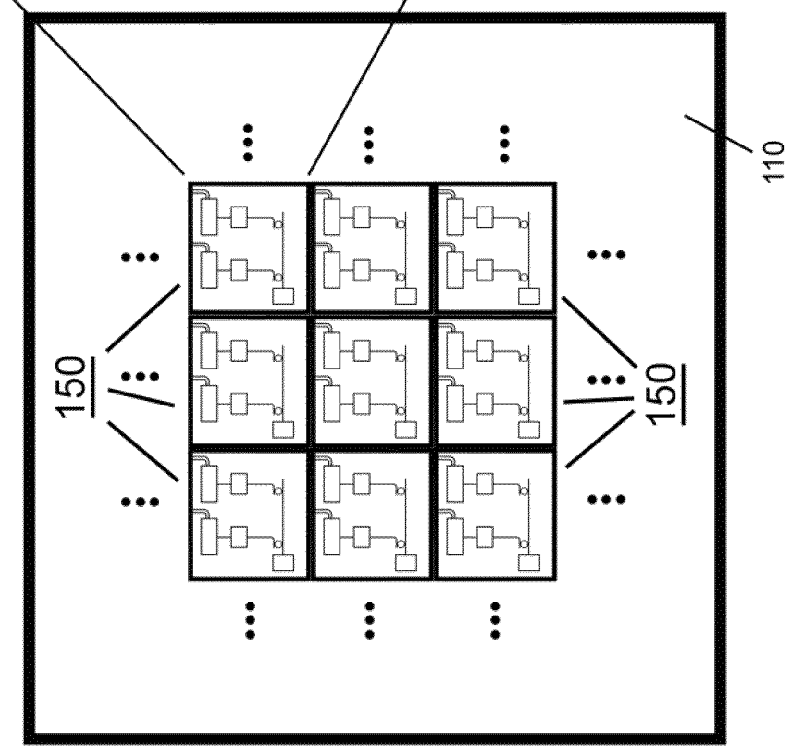
FIG. 19A is a drawing that shows a top view of an exemplary embodiment of a hyperspectral imaging photonic integrated circuit.
Figure 19D:
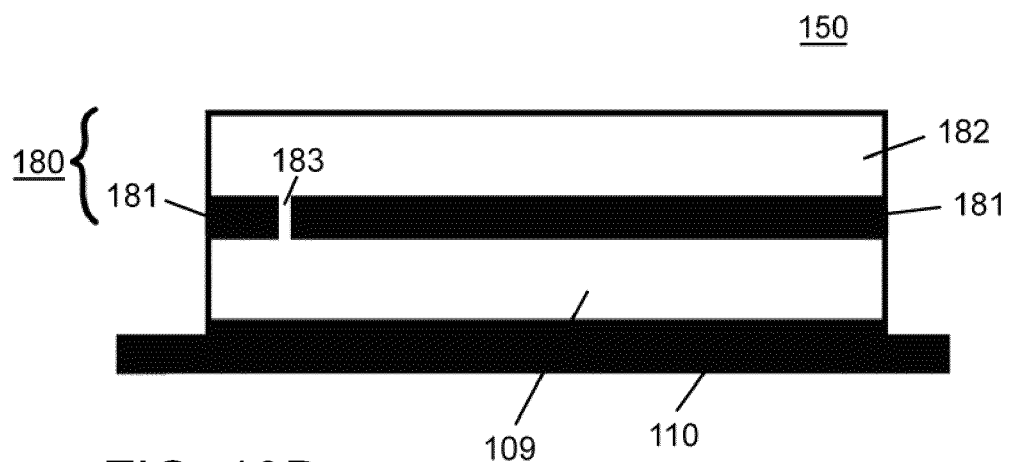
FIG. 19D is a drawing that shows a side view of an exemplary embodiment of a single pixel of a hyperspectral imaging photonic integrated circuit having an overlaying input coupler layer.

FIG. 19A to FIG. 19E show drawings of one exemplary embodiment of a hyperspectral imaging photonic integrated circuit 100 based on ring resonator filters 102. The photonic integrated circuit 100 includes an array of hyperspectral imaging pixels 150 as shown on the left side of the drawing (FIG. 19A). FIG. 19B is a drawing showing a detailed view of one exemplary pixel 150 fabricated on a substrate 110. A photonic integrated circuit 100 can have hundreds, thousands, or even millions of pixels depending on the application. For clarity and simplicity only 9 imaging pixels in a square 3×3 array are shown in FIG. 19A. The dotted lines are used to indicate that any row or column of the array can be extended by an indefinitely large number of elements. Arrays having one row or one column are also contemplated (e.g., 1×N arrays, or M×1 arrays). Also for clarity, within each exemplary pixel 150, only two ring resonators are shown in the detailed diagram. There can be any number of wavelength selective paths in each pixel 150, limited only by manufacturing integration density considerations.

In the exemplary pixel 150 of FIG. 19B, input coupler 101 accepts incoming electromagnetic energy 107 (e.g., electromagnetic radiation), typically light, having a plurality of wavelength components generally in the visible to the mid-infrared and/or longer wavelengths. The electromagnetic energy from input coupler 101 is optically coupled to waveguide 109. A plurality of filters (e.g. the plurality of ring resonator filters 102, 102,' 102" of FIG. 19B) is optically coupled to waveguide 109. The ring resonators 102, 102,' 102" can be tuned to couple radiation having a selected wavelength from waveguide 109 to waveguide 103, 103', respectively. As described above, wavelength filtering can be performed by any suitable types of filters. Waveguides 103, 103' convey each filtered wavelength or wavelength range to a respective detector, typically a photodetector (e.g. a photodiode 104, 104' of FIG. 19B). Any suitable type of electromagnetic radiation detector can be used. In some embodiments, the electrical signal from each photodiode 104, 104' is electrically coupled to support electronics 105, 105' (e.g. an amplifier or other type of electronic signal conditioning, such as electronic filtering). An electrical output signal for each wavelength or wavelength range representative of the intensity at that wavelength or wavelength range for each pixel 150 is output via a respective electrical output terminal 106, 106'. A side view of an exemplary pixel 150 fabricated on a substrate 110 is shown in FIG. 19C. Note that the planar photonic substrate can include a waveguide that includes a Group IV material. The waveguide can include a Group IV material that is selected from the group of that includes silicon-on-insulator technology, polycrystalline silicon on oxide, amorphous or nanocrystalline silicon on oxide, germanium on insulator, and silicon on sapphire.

As an example, in one embodiment, filters 102, 102', and 102" can be tuned to the visible colors red, green, and blue to achieve a RGB sensitive pixel. As is well known in the art, an RGB representation of an image can be used to accurately reproduce any visible color image. Other embodiments can similarly use suitable wavelengths, such as for inverse RGB imaging. There can also be four filters 102, 102', 102", and 102'" for color imaging, such as for CMYK (cyan, magenta, yellow, and key (black)) imaging. There is no limit to the number of filters and associated detectors and support electronics that can be provided, beyond the physical constraints of the size of each pixel.

Figure 19E:
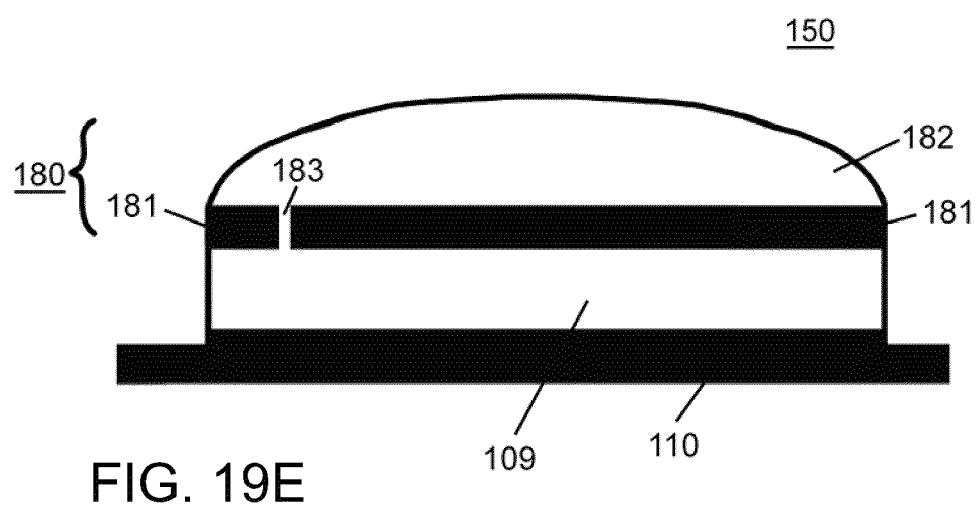
FIG. 19E is a drawing that shows a side view of an exemplary embodiment of a single pixel of a hyperspectral imaging photonic integrated circuit having an overlaying lens shaped input coupler layer.

Turning to the input coupler 101, in some embodiments, such as the embodiment depicted in the side view of FIG. 19C, each input coupler 101 collects light over a relatively small portion of the surface area of each pixel 150. One way to enhance the surface area over which an incident light is detected as described in more detail herein below, is to add a focusing layer over the photonics layer depicted in FIG. 19A. In other embodiments, as shown in the side view of FIG. 19D, there can be an additional layer 180 including input couplers, or arrays of input couplers (not shown in FIG. 19D), where by using an overlaying input coupler 182, each input coupler substantially fills the surface area of each pixel. Each overlaying input coupler 182 can be fabricated on an overlaying substrate 181 and optically coupled to the photonic layer below, such as via one or more optical waveguides 183. In other embodiments, as shown in FIG. 19E, each overlaying input coupler 182 can be shaped to act as a lens. There can be one large input coupler 182 having a lens shaped surface (FIG. 19E), or there can be an array input couplers substantially covering the substrate 181 of each pixel 150, each input coupler 182 having a lens shaped surface (not shown in FIG. 19E) that forms an overlaying input coupler 180.

In some embodiments, each electronic output terminal 106 for each wavelength (e.g., a color of visible light) from each pixel 150 is collected and directed to an image processor (not shown) to provide a real-time output of an image that can be recorded in a memory, that can be provided to another device for additional processing, and/or that can be displayed on a monitor. The image processor can be integrated on to the same substrate as the hyperspectral imaging photonic integrated circuit, or can be an image processor present in a separate component. An image processor can in various embodiments be any of a custom image processor, a microprocessor-based image processor, and a general purpose computer programmed with software to perform the functions of an image processor among one or more possible functions that the general purpose computer can provide. The image processor can also provide feedback and/or other control signals to tune the wavelength filters. For example, the wavelength filters can be tuned to obtain a different set of input wavelengths over the course of image collecting. In another mode of operation, the image processor can provide a control signal to dither the input wavelengths (e.g. to switch the detection range of any pixel back and forth from one wavelength set to another) to effectively increase the number of wavelengths (to create an effective broadband image) that can be saved to memory and/or monitored. The rate at which the dithering can be performed is limited only by the time required to process a signal from the ring resonator 102 through the photodiode 104 and on to the output terminal 106.

As described hereinabove, in some embodiments, the input coupler occupies only a small fraction of the area of each pixel. Therefore, only a relatively small fraction of the incident radiation arriving over the area of each pixel is captured by each pixel. To capture a substantially larger portion of the full set of incident optical intensity, a focusing layer can be used. In some embodiments, a separate focusing layer can be provided as a second substrate. For example, there can be a second substrate that is polished on both sides and/or made of material that is optically transparent at the wavelengths of interest. The second substrate can also be fabricated with a specified etched pattern. Such layers can include lenses that focus radiation from a series of apertures that cover the area of each pixel. The lenses can focus the light in a relatively broadband fashion into the coupler area. The lens-like behavior of the focusing layer can be achieved in a number of ways. For example, an array of Fresnel lenses can be fabricated on or in a focusing layer. While believed to be a practical option, Fresnel lenses might involve challenges related to angled etches. Another approach is to use a diffractive lens based on a series of partial etch heights in a dielectric.

Figure 20A:
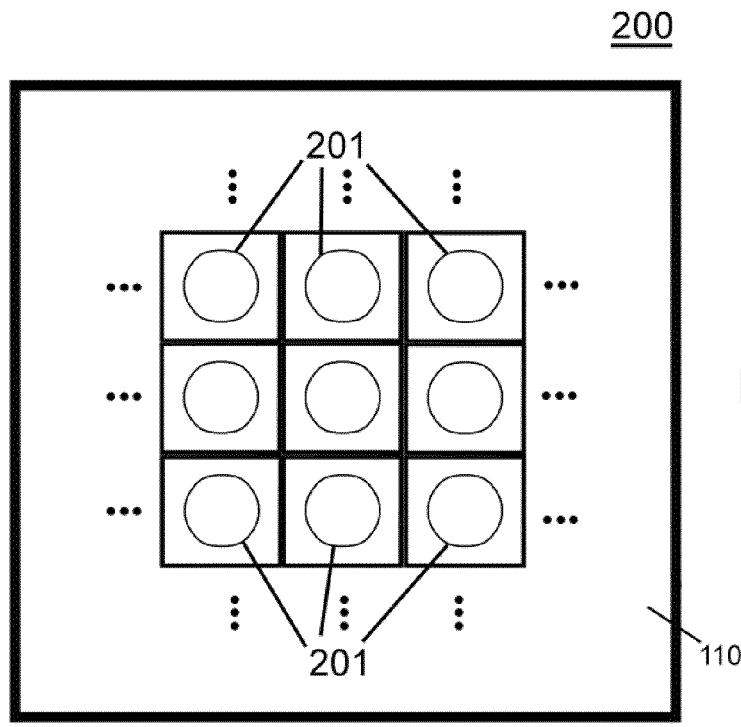
FIG. 20A is a drawing that shows a top view of an exemplary embodiment of a dual layer stack.
Figure 20B:
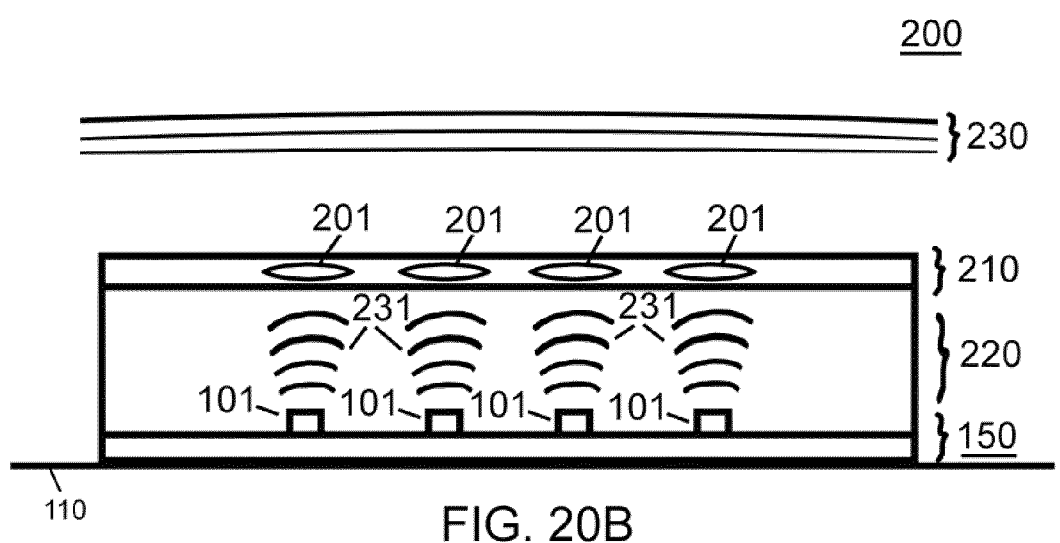
FIG. 20B is a drawing that shows a side view of an exemplary embodiment of a dual layer stack.

FIG. 20A shows a top view and FIG. 20B shows a side view of one exemplary embodiment of a dual layer stack 200 having an exemplary hyperspectral pixel substrate 150 with a focusing layer 210 disposed adjacent the hyperspectral pixel substrate. Incoming optical energy (electromagnetic radiation) 230 is concentrated through effective lenses 201 located within the focusing layer 210 resulting in focused optical radiation 231 incident on detectors 101. In typical embodiments, there is one lens 201 for each input coupler 101 of each pixel. In the exemplary embodiment of FIG. 20B, there is a transparent dielectric layer 220 disposed between the hyperspectral pixel substrate 150 and the lens array of the focusing layer 210. The transparent dielectric can be any convenient material having suitable optical properties to allow the electromagnetic radiation in the range of interest to pass.

Figure 21:
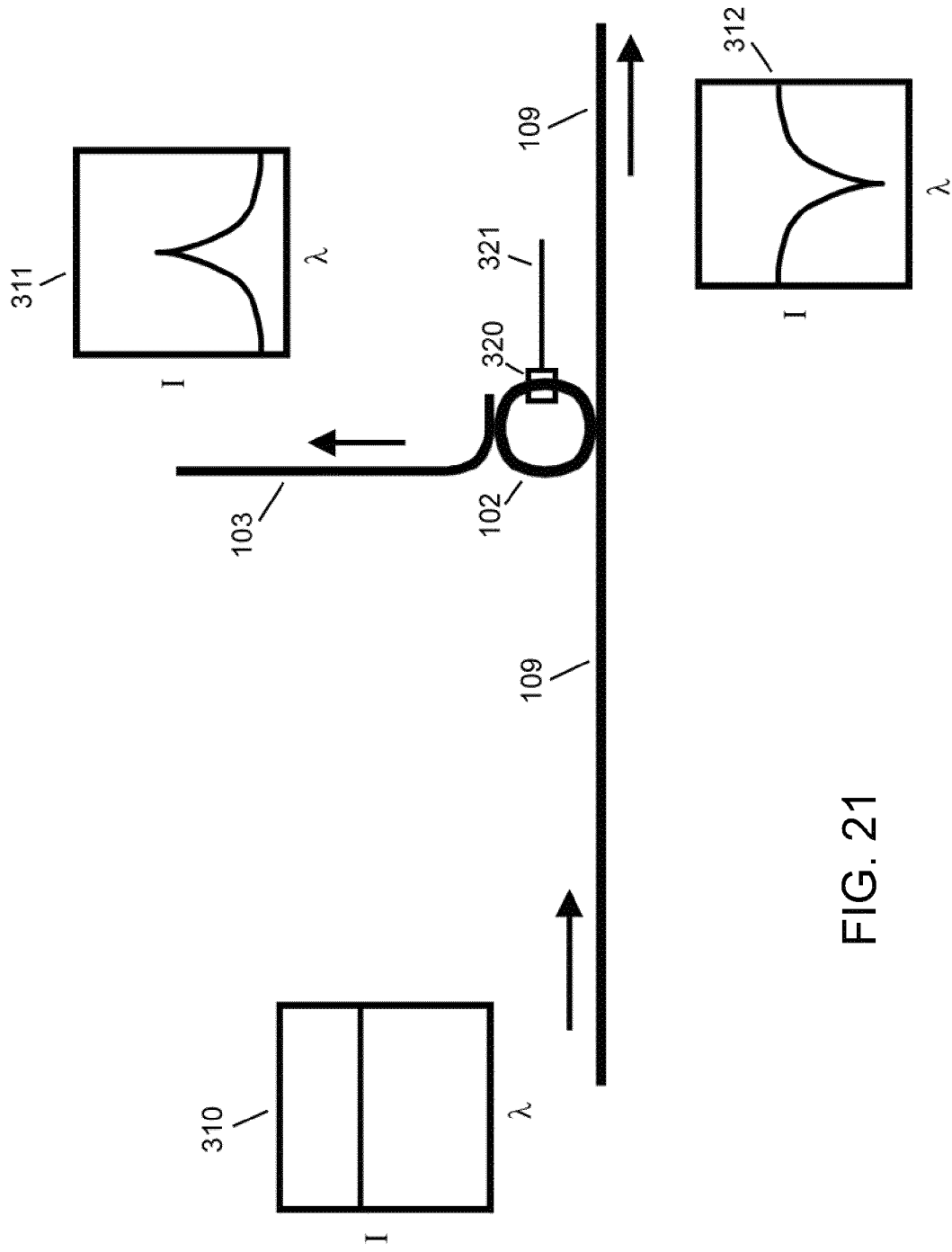
FIG. 21 shows a diagram of an exemplary ring resonator wavelength filter.

There are several options for on-chip wavelength filters. One particularly suitable candidate for the on-chip wavelength filters is a ring resonator. In ring resonators, an optical signal is evanescently coupled into a circular waveguide, which then drops a particular frequency. FIG. 21 shows a detailed exemplary diagram of a ring resonator wavelength filter used in a hyperspectral imaging pixel 150. Incoming electromagnetic radiation is received at an input coupler 101 and travels along waveguide 109. As represented by graph 310, which shows the intensity (I) of the electromagnetic radiation as a function of wavelength (λ), an example of input radiation having a uniform intensity with wavelength is illustrated for simplicity. It is expected that in general the intensity of the input electromagnetic radiation will vary with wavelength, and will in general be time-dependent as well, rather than being constant. Ring resonator 102 is configured to filter the radiation received via waveguide 109. Energy of a relatively narrow selected wavelength range (narrow band) is propagated via waveguide 103 to a photodetector (not shown in FIG. 21), such as a photodiode 104 of FIG. 19B. Graph 311 shows a plot of I versus λ of the selected wavelength range directed to a respective detector. The remaining energy of the radiation received via waveguide 109 continues to propagate via waveguide 109 past the ring resonator 102 to a next ring resonator tuned to a different wavelength range. Graph 312 shows a plot of I versus λ of the remaining electromagnetic energy (e.g., that energy remaining to be propagated along waveguide 109 after the energy represented by graph 311 is removed by ring resonator 102), which can be directed to a following detector via waveguide 109, and one or more additional ring resonators 102', 102" each tuned to a selected wavelength of interest. Each ring resonator 102, 102', 102" can be tuned to a desired wavelength range by an electrical tuning control 320 via an electrical control input 321. Any suitable ring resonator tuning method can be used. In some embodiments, where the wavelengths of interest do not vary with time or position (such as an RGB detector for use with visible illumination) the ring resonators may be designed to filter out signals having predetermined wavelengths for detection, and electrical tuning may not be required, or if implemented, may not need to be activated.

Figure 22:
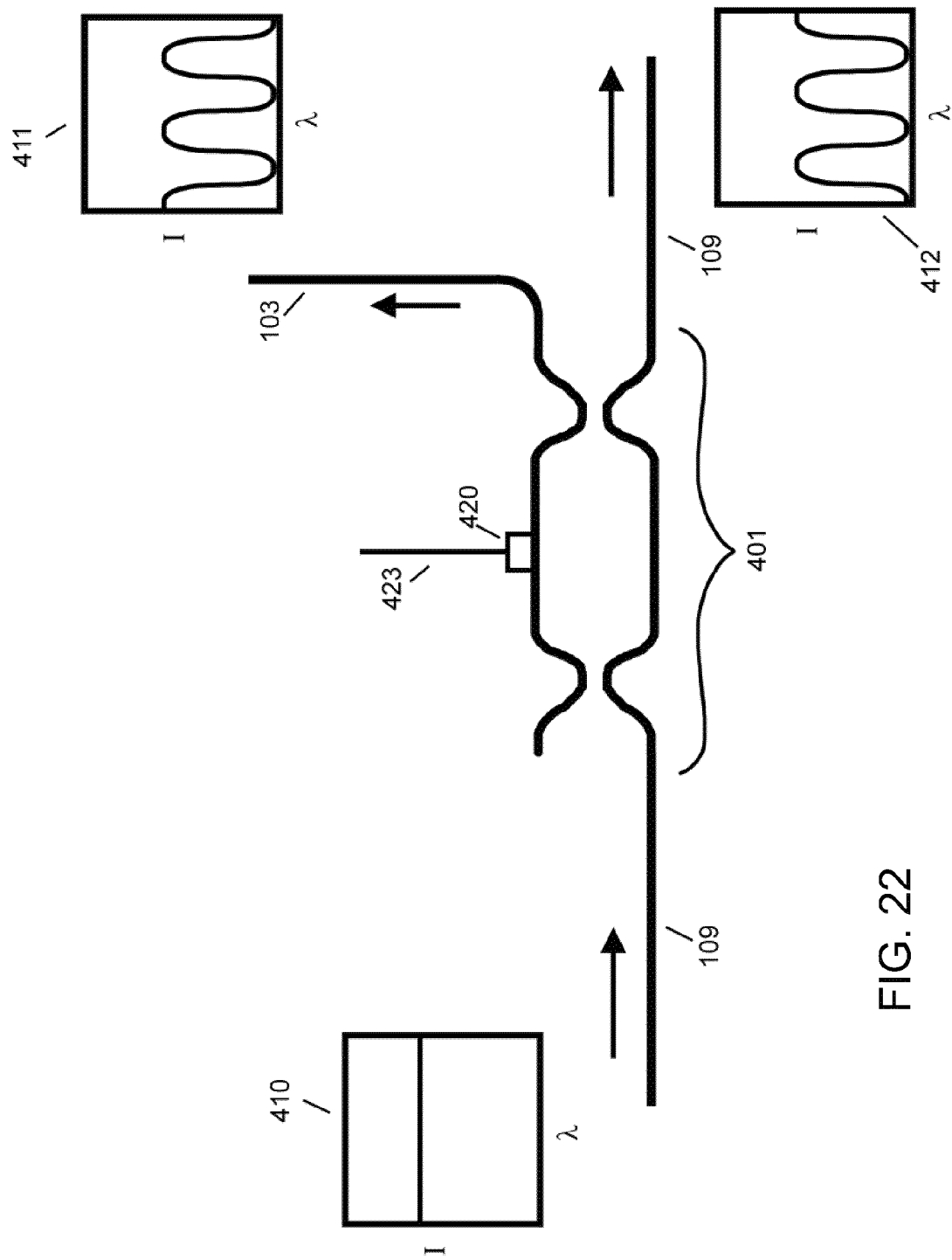
FIG. 22 shows a diagram of an exemplary tunable unbalanced Mach-Zehnder 401 wavelength filter.

Another suitable candidate for an on-chip wavelength filter is an unbalanced Mach-Zehnder interferometer device. The unbalanced Mach-Zehnder device approach provides a more broadband response when compared with the ring resonator approach. Which approach is preferable depends on the application. FIG. 22 shows a diagram of a tunable unbalanced Mach-Zehnder wavelength filter 401 used in a hyperspectral imaging pixel 150. Incoming electromagnetic radiation is received at an input coupler 101 and travels along waveguide 109. As represented by graph 410, which shows the intensity (I) of the electromagnetic radiation as a function of wavelength (λ), an example of input radiation having a uniform intensity with wavelength is illustrated for simplicity. It is expected that in general the intensity of the input electromagnetic radiation will vary with wavelength, and will in general be time-dependent as well, rather than being constant. Mach-Zehnder wavelength filter 401 is configured to filter the radiation propagating along waveguide 109. The Mach-Zehnder wavelength filter 401 is configured so that energy of selected wavelength ranges is propagated via waveguide 103 to a photodetector (not shown in FIG. 22), such as a photodiode 104 of FIG. 19B. Graph 411 shows a plot of I versus λ of the selected wavelength ranges directed to a respective detector by a specific Mach-Zehnder wavelength filter 401. The remaining energy of the radiation received via waveguide 109 continues to propagate along waveguide 109 past the Mach-Zehnder wavelength filter 401 to a next Mach-Zehnder wavelength filter 401' tuned to another selected wavelength range. Each Mach-Zehnder wavelength filter 401 can be tuned to a desired wavelength range by an electrical tuning control 420 via an electrical control input 421. Graph 412 shows a plot of I versus λ of the remaining electromagnetic energy (e.g., that energy remaining after the energy represented by graph 411 is removed by Mach-Zehnder wavelength filter 401) which can be directed to a following detector via waveguide 109. Any suitable Mach-Zehnder tuning method can be used. In some embodiments, where the wavelengths of interest do not vary with time or position (such as an RGB detector for use with visible illumination) the Mach-Zehnder interferometer-based filters may be designed to filter out signals having predetermined wavelengths for detection, and electrical tuning may not be required, or if implemented, may not need to be activated.

Now turning to input couplers (e.g. input coupler 101, FIG. 19B), one approach to input coupling is to use grating couplers such as those described by Laere, et al. in "Compact Focusing Grating Couplers for Silicon-on-Insulator Integrated Circuits," IEEE Photonics Technology Letters 19, 1919-1921 (2007). In some embodiments, input couplers can be provided by periodic scattering structures, which can form a phased scattering array for planar optical modes. However, while suitable for use in pixels of a hyperspectral imaging device, grating couplers tend to have significant insertion loss, and perhaps more importantly, they have a limited input bandwidth. In other embodiments, an etched edge input coupler can be used. An etched edge can take the form of a simple angular etch made in the photonic material, which can capture a near-diffraction limited spot. Such a near-diffraction limited spot can be the result of focusing from the diffractive lens or microlens layer, such as the microlens layer 210 of FIG. 20B. Note that light can be coupled into an imager from any suitable edge of the imager chip, such as for example at a cleaved or diced edge. (not shown in FIG. 19B).

Figure 23A:
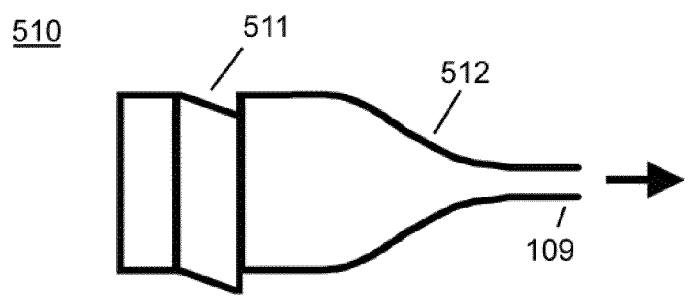
FIG. 23A is a drawing that shows a top view of one embodiment of an edge-etched input coupler.
Figure 23B:
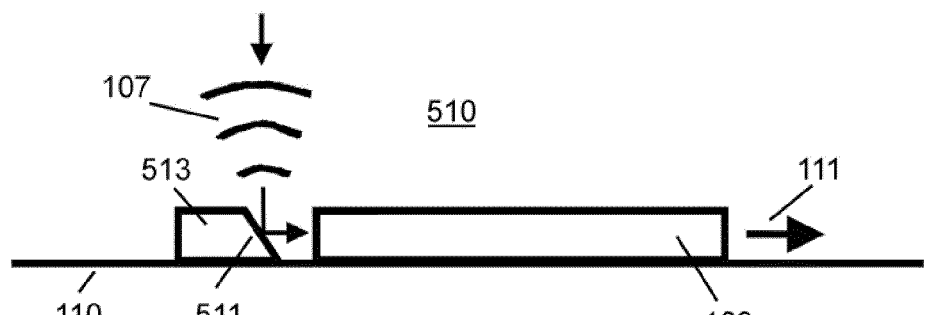
FIG. 23B is a drawing that shows a side view of one embodiment of an edge-etched input coupler.
Figure 23C:
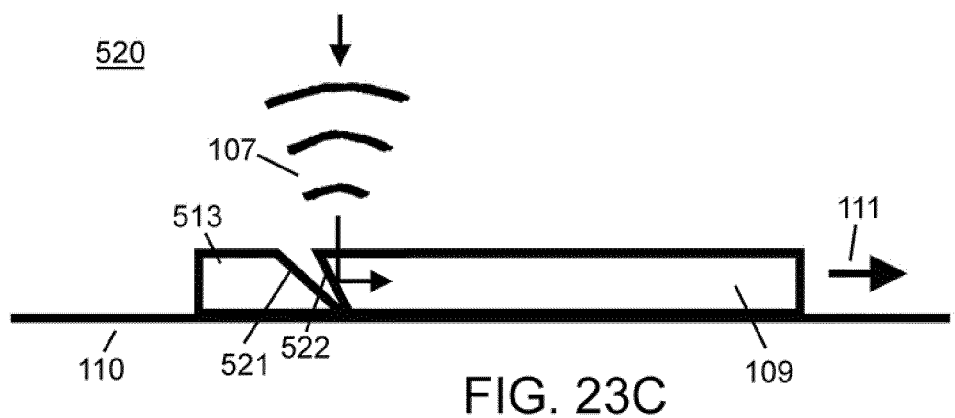
FIG. 23C is a side view drawing of another embodiment of an edge-etched input coupler.

FIG. 23A shows a top view drawing and FIG. 23B shows a side view drawing of one embodiment of an edge-etched input coupler 510. Input coupler 510 is based on etched edge 511, in this case in a completely etched layer of high index material 513 fabricated on a low index substrate 110. Broadband light 107 can be focused into the input coupling region, for example, from a focusing layer, with one dimension being compressed to the lateral limit of the etched edge 511. As can be seen in the side view drawing, focused light incident on etched edge 511 is reflected off etched edge 511 towards waveguide 109. A taper 512 best seen in FIG. 23A focuses the reflected light in a broadband fashion into a single mode waveguide 109. Electromagnetic radiation 111 propagates via waveguide 109 to successive components, such as wavelength filters 102. FIG. 23C shows a side view drawing of another embodiment of an edge-etched input coupler 520 having etched edges 521 and 522.

We return now to the focusing layer and a method for fabricating an effective lens for a focusing layer. A diffractive lens is one type of lens that is particularly applicable for a hyperspectral imaging device. In one method of fabricating an effective focusing layer which is expected to be particularly applicable for a hyperspectral imaging device a diffractive lens is fabricated by selectively partially etching a number of steps to provide different thicknesses in a dielectric layer. Selectively partial etching allows the introduction of an arbitrary phase shift ($\Delta\phi_n$) in the incident radiation for each thickness in the dielectric layer. If the thickness of the dielectric layer is on the order of a single wavelength, the relatively short path length will make the lens fairly broadband. Introducing such varying phase shifts at different parts of an optical beam allows the beam to be steered or focused.

Figure 24A:
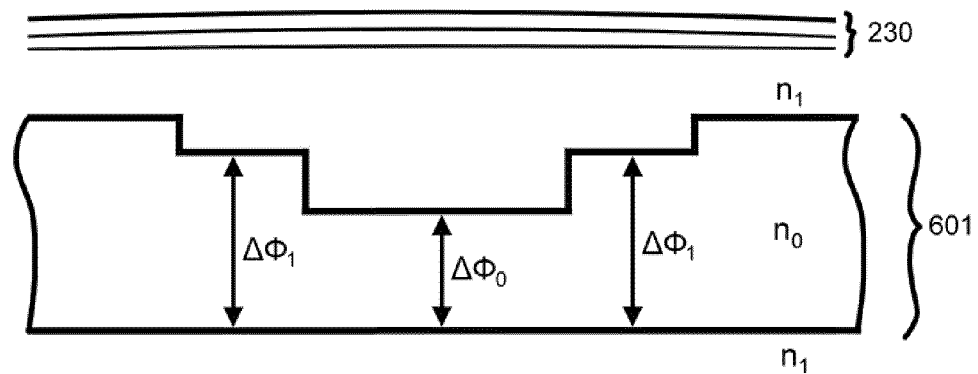
FIG. 24A is a drawing that shows a side view of a diffractive lens.
Figure 24B:
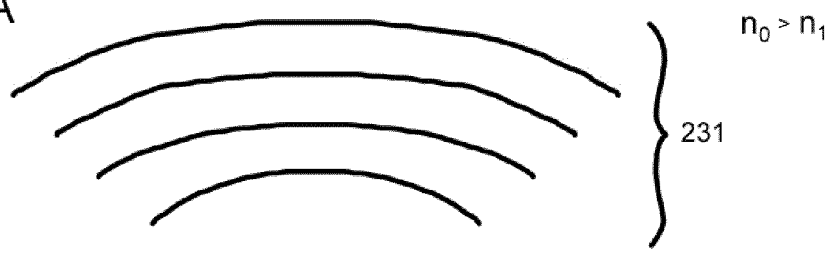
FIG. 24B is a drawing that shows a top view of a diffractive lens.
Figure 24B:
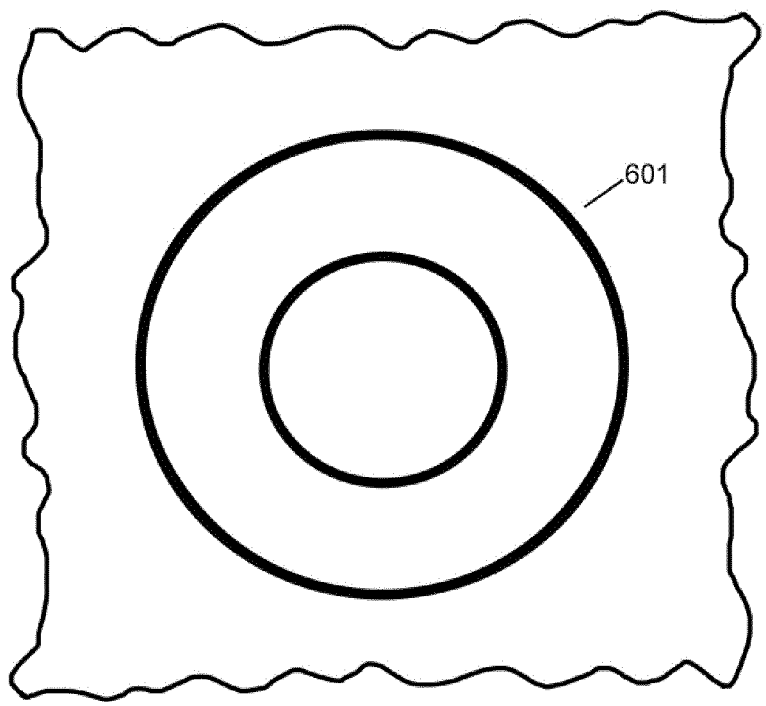

FIG. 24A shows a drawing in side view and FIG. 24B shows a drawing in top view of a focusing layer that illustrates one embodiment of a diffractive lens based on varying thickness of a dielectric layer. FIG. 24A and FIG. 24B illustrate the focusing process for a single pixel. FIG. 24A shows a side view of the cutaway section of the focusing layer. Incoming radiation 230 is focused into a focused optical mode radiation 231 by focusing layer 601. The selectively partially etched lens has a first phase shift etched depth that provides a first phase shift $\Delta\phi_1$ and a second phase shift etched depth that provides a second phase shift $\Delta\phi_2$. There can be any number of different etched depths, limited only by manufacturing integration density considerations. The materials surrounding the focusing layer have an index of refraction of $n_1$ and the exemplary focusing layer lenses are fabricated in a dielectric having an index of refraction of $n_0$, where $n_0 > n_1$.

It can now be seen that the different wavelength ranges of the pixels of a photonic integrated hyperspectral imager IC can be made sensitive to light, for example, in the red, blue, and green (RGB) wavelengths. Such ranges can be either fixed or tunable, and if tunable, tunable in real-time. Therefore, the integrated hyperspectral imager photonic ICs described herein are suitable for use in monochrome photographic and video recording devices and for use in color photographic and video recording devices, such as digital cameras, digital video recorders (e.g. camcorders), infrared cameras and night vision equipment. By suitable programming, based on the level of ambient illumination, a single device can be programmed to be operable to detect, display and record visible light images under higher ambient illumination, and to detect, display and record infrared images under low or minimal ambient illumination. It is contemplated that such photonic ICs can replace the CCD and CMOS imagers of the prior art.

It can also be seen that the integrated hyperspectral imager can further include at least one lens configured to receive light from an image to be recorded. The at least one lens can be optically coupled to at least one input coupler of the integrated hyperspectral imager. An electronic circuit can be electrically coupled to at least one detector output of the integrated hyperspectral imager. The electronic circuit can be configured to process at least one of the electrical signals representative of a hyperspectral image. A transmission circuit can be configured to transmit the image for further use. The combination of the integrated hyperspectral imager, the at least one lens, the electronic circuit and the transmission circuit can be configured to provide an optical imaging capability.

A suitable exemplary method for processing an image based on a received electromagnetic radiation includes the steps of: providing a photonic integrated hyperspectral imager as described hereinabove, the photonic integrated hyperspectral imager configured to process in real-time broadband input electromagnetic radiation having at least a first wavelength and a second wavelength; acquiring an image at the first wavelength; and if the image is to be recorded, recording the image at the first wavelength to memory; or if the image is to be transmitted, transmitting the image at the first wavelength to a user thereof; acquiring an image at the second wavelength; and if the image is to be recorded, recording the image at the second wavelength to memory; or if the image is to be transmitted, transmitting the image at the second wavelength to a user thereof. In some embodiments, the steps of acquiring an image at the first wavelength and acquiring an image at the second wavelength are performed contemporaneously. In other embodiments, the steps of acquiring an image at the first wavelength and acquiring an image at the second wavelength are performed sequentially. In yet other embodiments, the steps of acquiring an image at the first wavelength and acquiring an image at the second wavelength are performed sequentially by dithering the wavelength filters.

As described in greater detail herein, the present invention provides methods and structures that exhibit enhancement of the nonlinear effects in various electro-optical materials that is sufficient to make the nonlinear effects accessible with continuous-wave, low-power lasers. As is described herein the waveguide is coated or clad with another material which provides or exhibits an enhanced nonlinear optical coefficient, such as certain kinds of organic electro-optical materials that can be specifically designed to operate in various regions of the electromagnetic spectrum. It is to be understood that if the high contrast waveguide core material itself exhibits a sufficiently large nonlinear optical coefficient of the correct order, for example, a $\chi^2$ or a $\chi^3$ coefficient, the cladding may be omitted and the waveguide core itself can provide the nonlinear optical effects of interest.

DEFINITIONS

Recording the results from an imaging operation or image acquisition, such as for example, recording results at a particular wavelength, is understood to mean and is defined herein as writing output data to a storage element, to a machine-readable storage medium, or to a storage device. Machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer. As such, recording such as "Writing output data" or "writing an image to memory" includes streaming data, such as streaming video sent from a transmission circuit.

"Microcomputer" is defined herein as synonymous with microprocessor, microcontroller, and digital signal processor ("DSP"). It is understood that memory used by the microcomputer, including for example an imaging or image processing algorithm coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

THEORETICAL DISCUSSION

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

We claim:

1. An integrated hyperspectral imager comprising:
a planar photonic substrate; and
a plurality of imaging pixel photonic circuits disposed in a M×N array on said planar photonic substrate, each imaging pixel photonic circuit comprising:
an input coupler configured to receive a broadband input electromagnetic radiation;
a waveguide optically coupled to said input coupler;
a plurality of wavelength filters optically coupled to said waveguide, each wavelength filter of said plurality of wavelength filters having a wavelength filter input and a wavelength filter output; and
a plurality of detectors, each detector of said plurality of detectors having a detector input optically coupled respectively to each of said wavelength filter outputs, each detector of said plurality of detectors having a respective detector output;
said integrated hyperspectral imager configured to provide at said detector outputs of each of said plurality of imaging pixel photonic circuits electrical signals representative of a hyperspectral image of said received broadband input electromagnetic radiation.

2. The integrated hyperspectral imager of claim 1, wherein said planar photonic substrate comprises a waveguide comprising a material containing an element from Group IV of the periodic table.

3. The integrated hyperspectral imager of claim 2, wherein said waveguide comprising a material containing an element from Group IV of the periodic table is selected from the group consisting of silicon-on-insulator, polycrystalline silicon on oxide, amorphous or nanocrystalline silicon on oxide, germanium on insulator, and silicon on sapphire.

4. The integrated hyperspectral imager of claim 1, wherein said broadband input electromagnetic radiation comprises a range of wavelengths within a range of electromagnetic radiation from visible wavelengths to infrared wavelengths.

5. The integrated hyperspectral imager of claim 1, wherein at least one wavelength filter of said plurality of wavelength filters comprises a ring resonator based filter.

6. The integrated hyperspectral imager of claim 1, wherein at least one wavelength filter of said plurality of wavelength filters comprises a Mach-Zehnder based filter.

7. The integrated hyperspectral imager of claim 1, wherein said integrated hyperspectral imager further comprises a focusing layer configured to focus incident light onto each input coupler.

8. The integrated hyperspectral imager of claim 7, wherein said focusing layer comprises a plurality of lenses.

9. The integrated hyperspectral imager of claim 7, wherein at least one lens of said plurality of lenses comprises a Fresnel lens.

10. The integrated hyperspectral imager of claim 7, wherein at least one lens of said plurality of lenses comprises a diffractive lens based on a series of partial etch heights in a dielectric.

11. The integrated hyperspectral imager of claim 1, wherein said input coupler comprises a grating coupler.

12. The integrated hyperspectral imager of claim 1, wherein said input coupler comprises a plurality of periodic scattering structures.

13. The integrated hyperspectral imager of claim 1, wherein said input coupler comprises an etched edge input coupler.

14. The integrated hyperspectral imager of claim 1, wherein said light is coupled from an edge of said imager.

15. The integrated hyperspectral imager of claim 1, wherein at least one detector of said plurality of detectors comprises a photodiode.

16. The integrated hyperspectral imager of claim 1, wherein said integrated hyperspectral imager further comprises an electronic circuit electrically disposed between said detector and said detector output, said electronic circuit integrated on said planar photonic substrate.

17. The integrated hyperspectral imager of claim 1, further comprising:
at least one lens configured to receive light from an image to be recorded, said at least one lens optically coupled to at least one input coupler of said integrated hyperspectral imager;
an electronic circuit electrically coupled to at least one detector output of said integrated hyperspectral imager, said electronic circuit configured to process at least one of said electrical signals representative of a hyperspectral image; and
a memory configured to record said image as a digital recording;
said combination of said integrated hyperspectral imager, said at least one lens, said electronic circuit and said memory configured to provide an optical recording capability.

18. The integrated hyperspectral imager of claim 17, wherein said optical recording capability includes a selected one of a still image recording capability, a sequential still image recording capability, and a video image recording capability.

19. The integrated hyperspectral imager of claim 1, further comprising:
at least one lens configured to receive light from an image to be recorded, said at least one lens optically coupled to at least one input coupler of said integrated hyperspectral imager;
an electronic circuit electrically coupled to at least one detector output of said integrated hyperspectral imager, said electronic circuit configured to process at least one of said electrical signals representative of a hyperspectral image; and
a transmission circuit configured to transmit said image for further use said combination of said integrated hyperspectral imager, said at least one lens, said electronic circuit and said transmission circuit configured to provide an optical imaging capability.

20. A method for processing an image based on a received electromagnetic radiation comprising the steps of:
providing a photonic integrated hyperspectral imager according to claim 1, said photonic integrated hyperspectral imager configured to process in real-time broadband input electromagnetic radiation having at least a first wavelength and a second wavelength;
acquiring an image at said first wavelength; and
if said image is to be recorded, recording said image at said first wavelength to memory; or
if said image is to be transmitted, transmitting said image at said first wavelength to a user thereof;
acquiring an image at said second wavelength; and
if said image is to be recorded, recording said image at said second wavelength to memory; or
if said image is to be transmitted, transmitting said image at said second wavelength to a user thereof.

21. The method for recording an image based on a received electromagnetic radiation of claim 20, wherein said steps of acquiring an image at said first wavelength and acquiring an image at said second wavelength are performed contemporaneously.

22. The method for recording an image based on a received electromagnetic radiation of claim 20, wherein said steps of acquiring an image at said first wavelength and acquiring an image at said second wavelength are performed sequentially.

23. The method for recording an image based on a received electromagnetic radiation of claim 20, wherein said steps of acquiring an image at said first wavelength and acquiring an image at said second wavelength are performed sequentially by dithering said wavelength filters.

* * * * *